(12) United States Patent
Oka

(10) Patent No.: US 11,240,894 B2
(45) Date of Patent: Feb. 1, 2022

(54) DRIVE CIRCUIT, LIGHT EMITTING DEVICE, DISTANCE MEASUREMENT APPARATUS, AND MOBILE BODY

(71) Applicant: Ricoh Company, Ltd., Tokyo (JP)

(72) Inventor: Yuuki Oka, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 100 days.

(21) Appl. No.: 16/687,816

(22) Filed: Nov. 19, 2019

(65) Prior Publication Data

US 2020/0178361 A1 Jun. 4, 2020

(30) Foreign Application Priority Data

Nov. 30, 2018 (JP) .............................. JP2018-225890
Sep. 20, 2019 (JP) .............................. JP2019-172038

(51) Int. Cl.
*H05B 45/35* (2020.01)
*H05B 45/37* (2020.01)
*G01S 17/08* (2006.01)

(52) U.S. Cl.
CPC .............. *H05B 45/37* (2020.01); *G01S 17/08* (2013.01)

(58) Field of Classification Search
CPC ..... H05B 45/37; H05B 45/3725; G01S 17/08; G01S 17/42; G01S 17/931; G01S 7/4815; G01S 7/484; H01S 5/423; H01S 5/0428
See application file for complete search history.

(56) References Cited

U.S. PATENT DOCUMENTS

| 2018/0188373 | A1* | 7/2018 | Yokota .................... G01S 17/93 |
| 2018/0267152 | A1* | 9/2018 | McMichael ............. G01S 17/14 |
| 2018/0269651 | A1 | 9/2018 | Oka et al. |
| 2019/0250270 | A1 | 8/2019 | Suzuki et al. |

FOREIGN PATENT DOCUMENTS

| JP | 2009-170870 | 7/2009 |
| JP | 2017-028235 | 2/2017 |
| WO | WO2004/045251 A1 | 5/2004 |

* cited by examiner

*Primary Examiner* — Minh D A
(74) *Attorney, Agent, or Firm* — Xsensus LLP

(57) ABSTRACT

A drive circuit includes a plurality of capacitors; a plurality of first interrupters configured to select paths through which electric charges are supplied to the plurality of capacitors; and a plurality of second interrupters configured to select paths through which the plurality of capacitors supply electric charges to a plurality of light emitting elements. In a case where the first interrupters are controlled and an electric charge is stored in a capacitor corresponding to one light emitting element included in the plurality of light emitting elements to selectively turn on the one light emitting element, at least while an electric charge is supplied to a light emitting element to be turned on, one second interrupter coupled to a path through which an electric charge is supplied to a light emitting element not to be turned on interrupts the path.

16 Claims, 23 Drawing Sheets

DRIVE CIRCUIT, LIGHT EMITTING DEVICE, DISTANCE MEASUREMENT APPARATUS, AND MOBILE BODY

CROSS-REFERENCE TO RELATED APPLICATIONS

This patent application is based on and claims priority pursuant to 35 U.S.C. § 119(a) to Japanese Patent Application No. 2018-225890, filed on Nov. 30, 2018 and Japanese Patent Application No. 2019-172038, filed on Sep. 20, 2019 in the Japan Patent Office, the entire disclosure of which is hereby incorporated by reference herein.

BACKGROUND

Technical Field

The present disclosure relates to a drive circuit, a light emitting device, a distance measurement apparatus, and a mobile body.

Description of the Related Art

Conventionally, a light emitting device that drives a light emitting element, such as a laser diode or a light emitting diode (LED), is known. Such a light emitting device is used in, for example, a distance measurement apparatus for measuring the distance to an object.

In this case, the distance measurement apparatus can be implemented by a light emitting element, a drive circuit that supplies a drive current to the light emitting element, a light receiving device that receives the reflected light from an object to be measured, and a controller that calculates the distance to the object to be measured based on the difference between the time at which light is emitted and the time at which light is received. Moreover, in a distance measurement apparatus, light emitting elements may be arranged in an array or a matrix, and desirable ones of the light emitting elements are individually driven to selectively emit light, thereby increasing the resolution in the vertical direction and the lateral direction.

SUMMARY

In one aspect of this disclosure, there is provided an improved drive circuit includes a plurality of capacitors; a plurality of first interrupters configured to select paths through which electric charges are supplied to the plurality of capacitors; and a plurality of second interrupters configured to select paths through which the plurality of capacitors supply electric charges to a plurality of light emitting elements. In a case where the first interrupters are controlled and an electric charge is stored in a capacitor corresponding to one light emitting element included in the plurality of light emitting elements to selectively turn on the one light emitting element, at least while an electric charge is supplied to a light emitting element to be turned on, one second interrupter coupled to a path through which an electric charge is supplied to a light emitting element not to be turned on interrupts the path.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
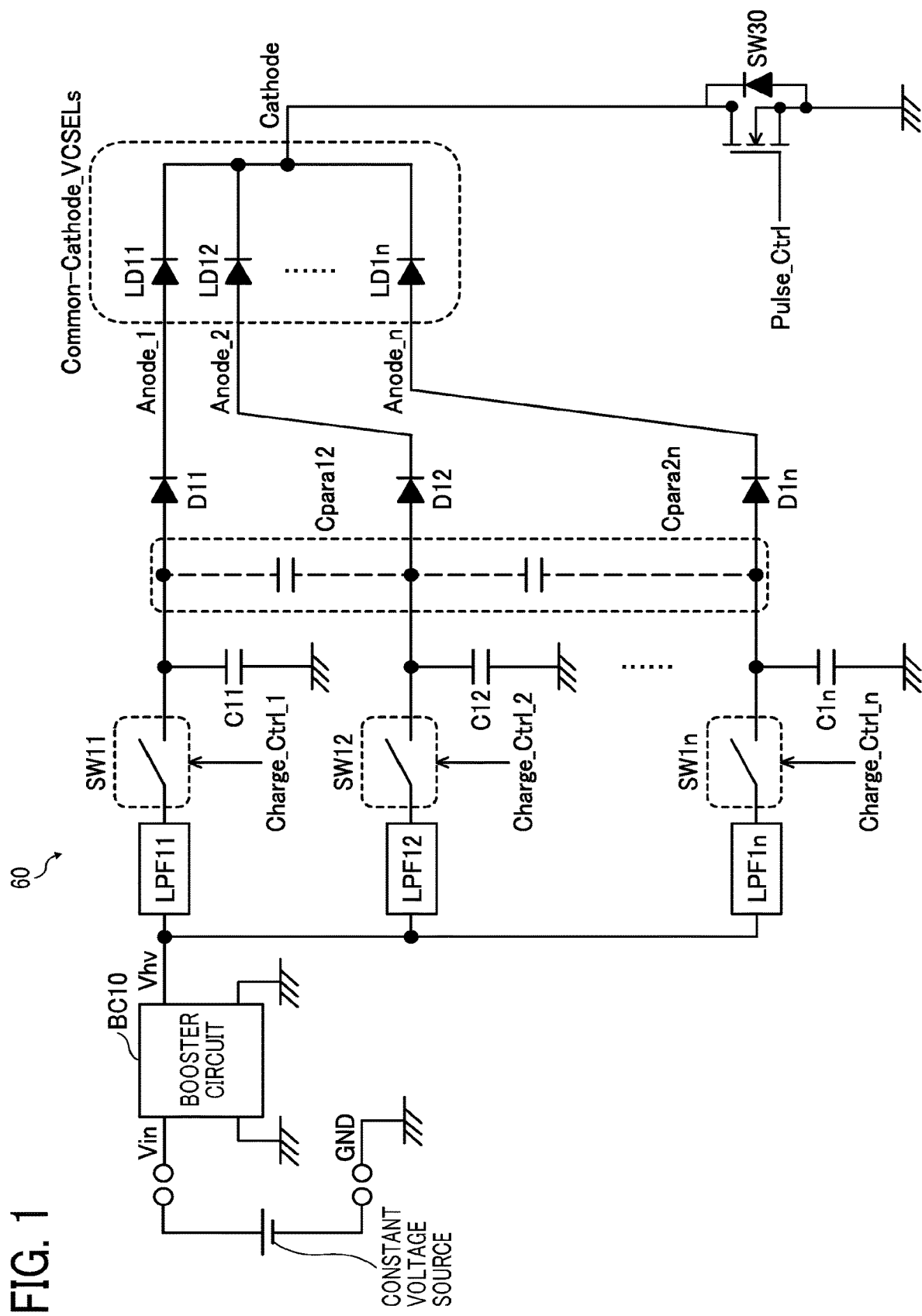
FIG. 1 is a circuit diagram illustrating a circuit configuration of a light emitting device according to a comparative example to describe a disadvantage found by the inventor.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Disadvantage Found by Inventor

A disadvantage found by the inventor of the disclosure is described first. Embodiments of the disclosure presuppose the disadvantage. In the following description, a case where a light emitting device is installed in a laser-scanning light detection and ranging (LiDAR) apparatus, which serves as a distance measurement apparatus, is expected as an example for describing the disadvantage.

The light emitting device used in the LiDAR apparatus is demanded to measure a distance using emission of light with short pulse. This is because such a light emitting device requires to emit nanosecond-order high-energy light to measure a long distance while reducing the influence of disturbance light such as sun light.

Thus, the LiDAR apparatus uses a light emitting device of pulse based time-of-flight (TOF) system. The light emitting device of pulse based TOF system includes a capacitor that stores an electric charge. The light emitting device of pulse based TOF system includes a capacitor that stores an electric charge with a high voltage in a range from several tens to several hundreds of volts. The capacitor is, for example, a multilayer ceramic capacitor with low equivalent series inductance (ESL). The light emitting device causes a switching element, which is located downstream of the capacitor, to make a short in a circuit to feed a short-circuit current, thereby providing an output with nanosecond-order ultra-short pulse and high current.

However, when driving with nanosecond-order current is performed in this way, the influence of inductance components parasitic on wiring and parts of a circuit increases. Due to this, the inventor of the disclosure has found that a disadvantage arises when a desirable light emitting element is driven in a light emitting device according to the comparative example.

The disadvantage is that, when a desirable light emitting element is driven, an electric charge flows to another light emitting element due to induced current to be generated and high-frequency noise to be radiated, while parasitic capacitances of parts and wiring of a drive circuit that drives the other light emitting element serve as a path, and the other light emitting element emits light. When the other light emitting element emits light in this way, the light intensity decreases, and the measurable distance decreases.

Figure 3:
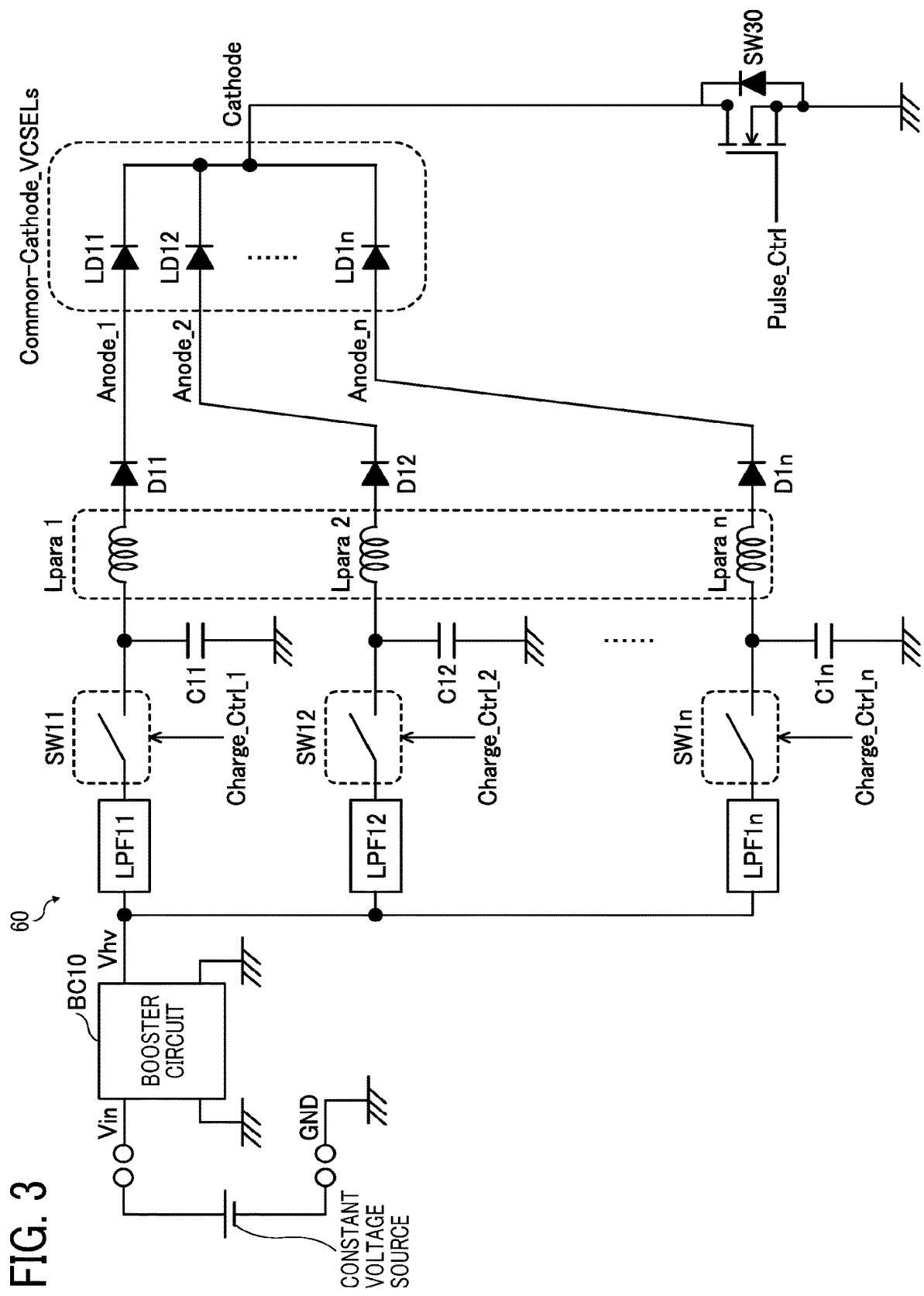
FIG. 3 is a circuit diagram illustrating the circuit configuration of the light emitting device according to the comparative example to describe the disadvantage found by the inventor.
Figure 4:
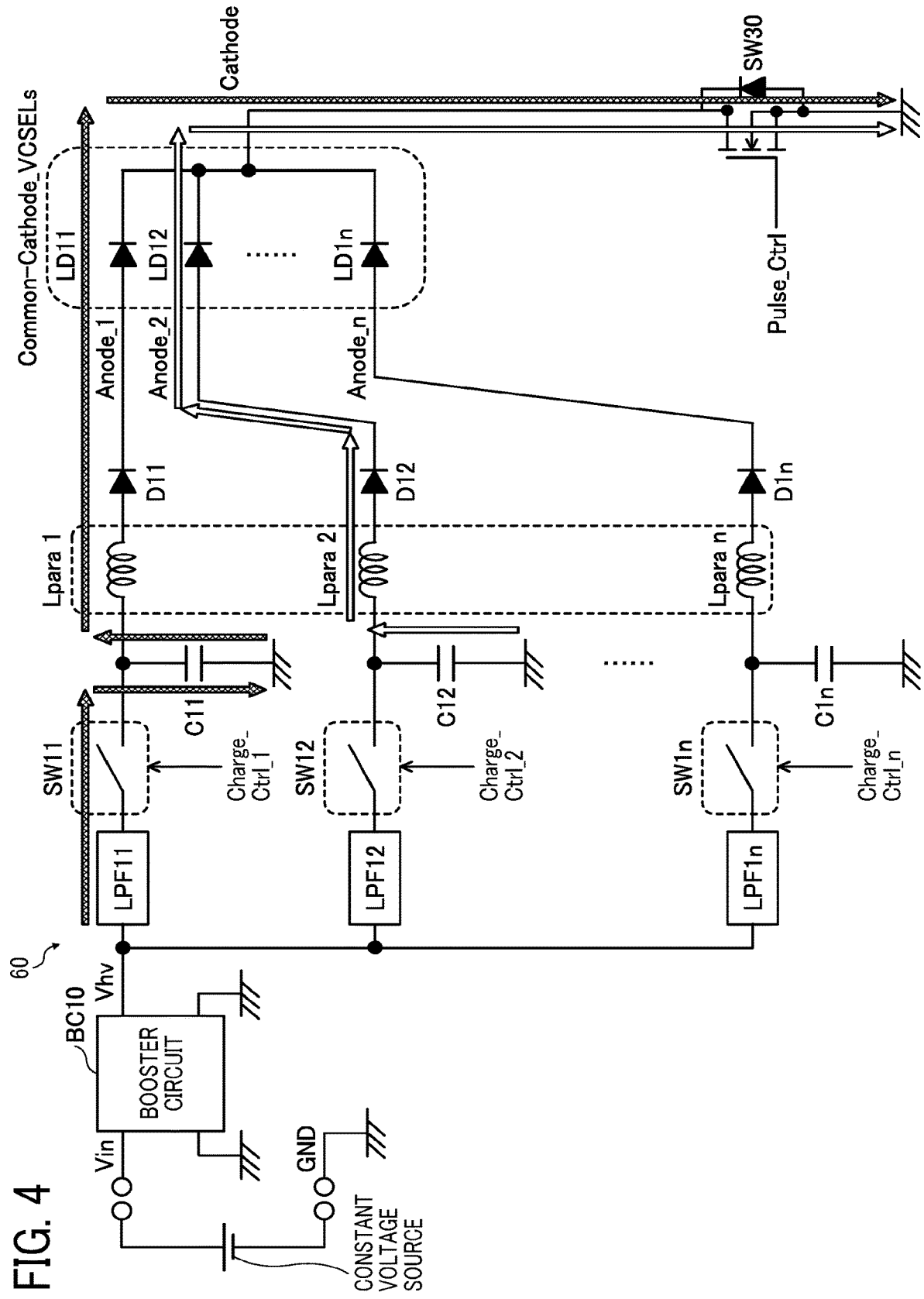
FIG. 4 is a circuit diagram illustrating the circuit configuration of the light emitting device of the related art to describe the disadvantage found by the inventor.
Figure 5:
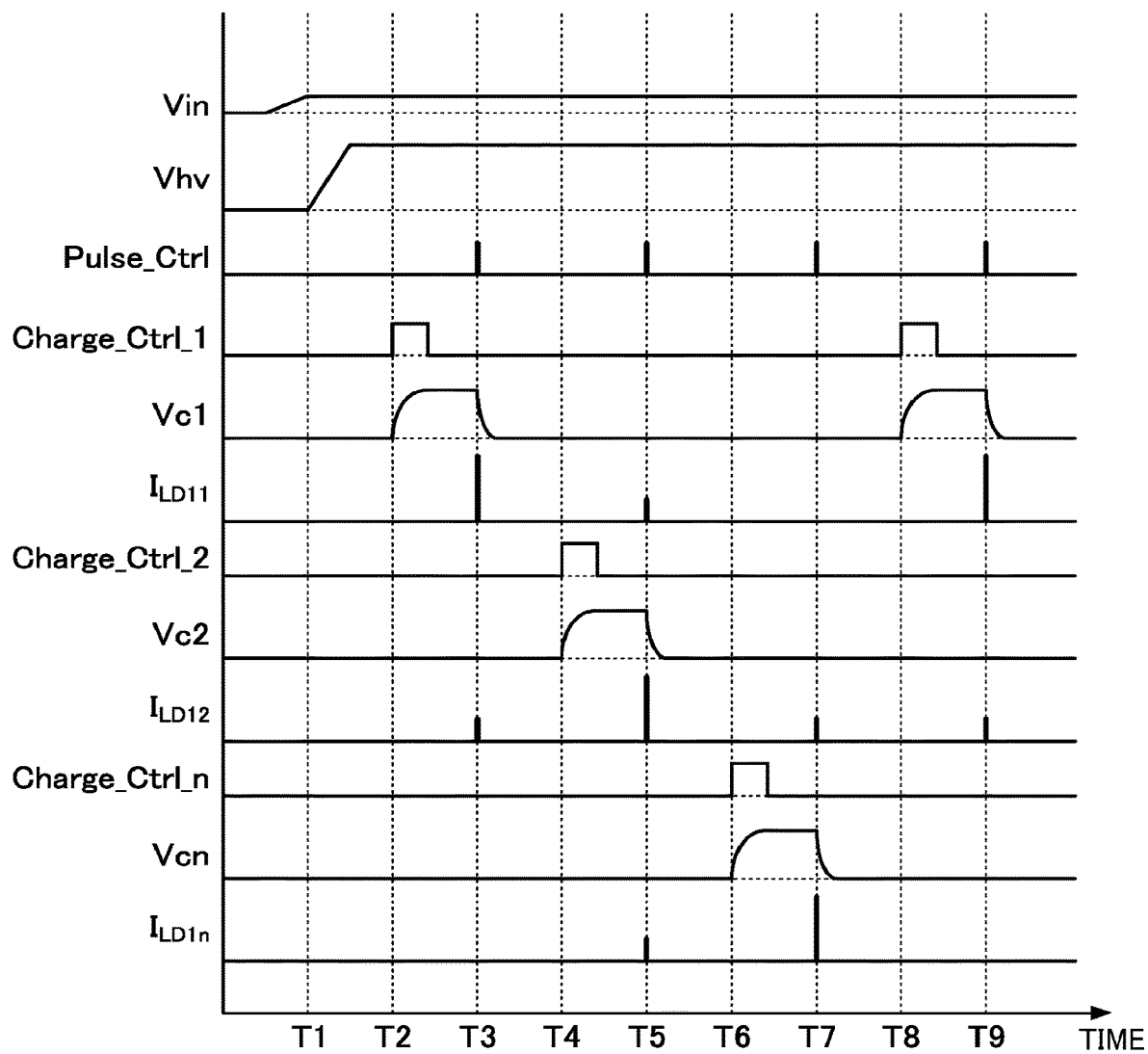
FIG. 5 is a timing chart illustrating a driving state of the light emitting device according to the comparative example to describe the disadvantage found by the inventor.

The disadvantage is described in more detail referring to FIGS. 1 to 5. FIGS. 1 to 4 are circuit diagrams each illustrating a circuit configuration of a light emitting device according to the comparative example. FIG. 5 is a timing chart illustrating a driving state of the light emitting device according to the comparative example.

As illustrated in FIG. 1, a light emitting device 60, which is a light emitting device according to the comparative example, includes a booster circuit BC10, a plurality of low pass filters LPF (a low pass filter LPF11, a low pass filter LPF12, . . . , and a low pass filter LPF1n), a plurality of first switch elements SW (a first switch element SW11, a first switch element SW12, . . . , and a first switch element SW 1n), a plurality of capacitors C (a capacitor C11, a capacitor C12, . . . , and a capacitor C1n), a plurality of diodes D (a diode D11, a diode D12, . . . , and a diode D1n), a plurality of laser diodes LD (a laser diode LD11, a laser diode LD12, and a laser diode LD1n), and a third switch element SW30. FIG. 1 illustrates capacitors that are located downstream of the plurality of capacitors C (the capacitor C11, the capacitor C12, . . . , and the capacitor C1n) and that are surrounded by a broken line. The capacitors are conceptually illustrated to describe parasitic capacitances and do not actually exist.

In the light emitting device 60 having such a configuration, the booster circuit BC10 boosts a direct-current voltage Vin, supplied from an external constant voltage source, to obtain a direct-current voltage Vhv, and supplies the direct-current voltage Vhv to each low pass filter LPF. Moreover, each first switch element SW is controlled to supply an electric charge to a desirable capacitor C. Then, the third switch element SW30 is controlled to cause a short in the circuit, so that a short-circuit current is generated from the electric charge stored in the capacitor C and the current with a very short pulse width (for example, 5 ns or less) is fed to a laser diode LD serving as a light emitting element. Accordingly, light with short pulse and high energy can be obtained.

Figure 2:
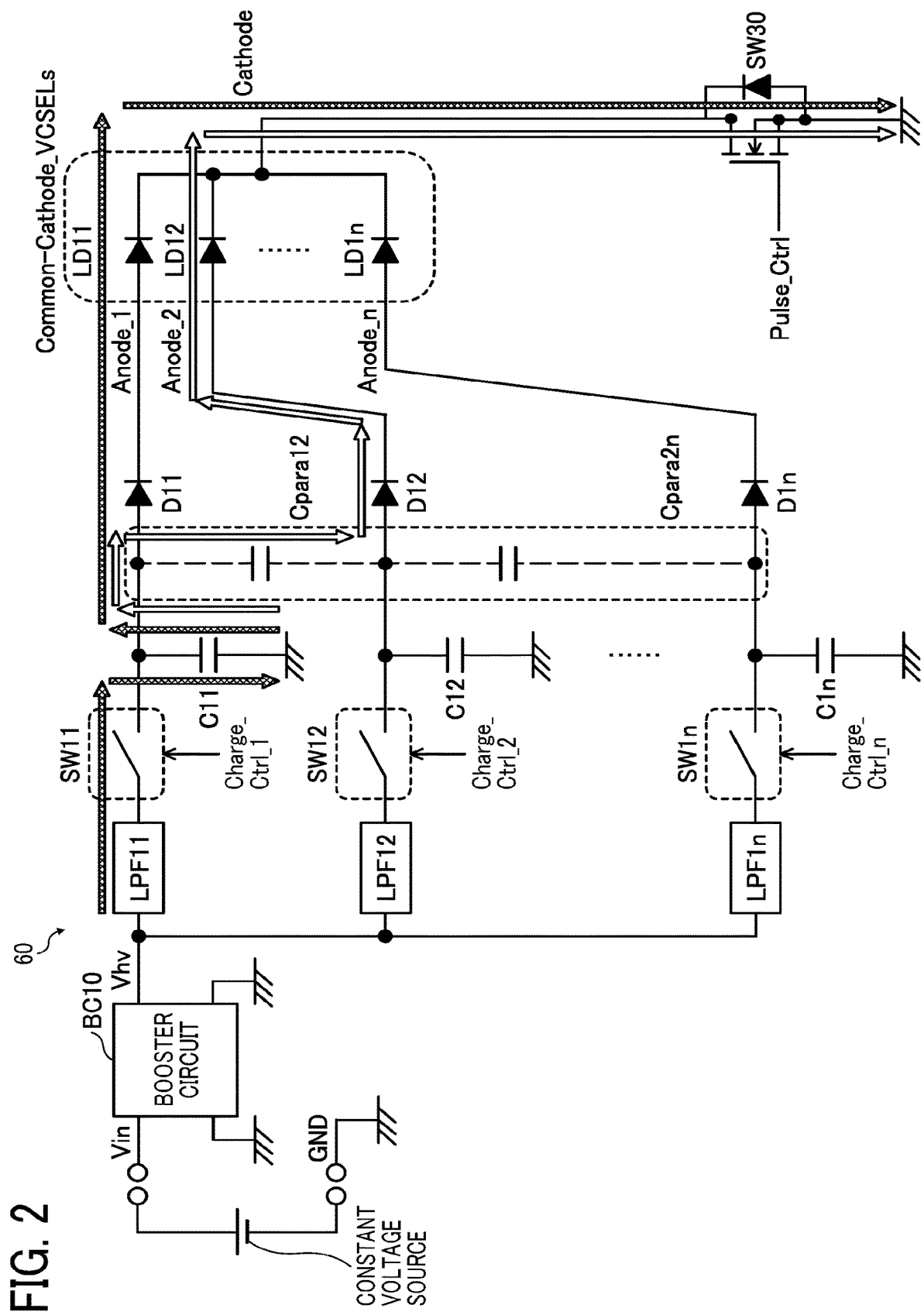
FIG. 2 is a circuit diagram illustrating the circuit configuration of the light emitting device according to the comparative example to describe the disadvantage found by the inventor.

However, in the light emitting device 60, a parasitic capacitance corresponding to the capacitors surrounded by the broken line is generated although the parasitic capacitance is very small (for example, in a range from 1 to 10 pF). When very-short-pulse current is fed, a loop through which the current flows to another laser diode other than the desirable laser diode is formed via the parasitic capacitance. For example, when an electric charge is supplied to the capacitor C11 as illustrated in FIG. 2 to intend to cause the laser diode LD11 to emit light, the current may also flow to another laser diode LD12 via the parasitic capacitance.

Moreover, an inductor is parasitic on the light emitting device 60 in addition to such a parasitic capacitance. Specifically, as illustrated in FIG. 3, inductors surrounded by a broken line are parasitic on portions that are located downstream of the plurality of capacitors C (the capacitor C11, the capacitor C12, . . . , and the capacitor Cin). The inductors are conceptually illustrated to describe parasitic inductors and do not actually exist.

Although the parasitic inductors have very small capacitances (for example, in a range from 0.1 to 3 nH), when very-short-pulse current is fed, the inductors are coupled to each other, and a loop through which the current flows to another laser diode other than a desirable laser diode is formed due to induced current. For example, when an electric charge is supplied to the capacitor C11 as illustrated in FIG. 4 to intend to cause the laser diode LD11 to emit light, the current may flow to another laser diode LD12 via the parasitic inductor.

As described above, the case where current flows to another laser diode is described referring to the timing chart in FIG. 5. The supply of the direct-current voltage Vhv is started at a time T1 in response to the supply of the direct-current voltage Vin.

At a time T2, the first switch element SW11 is controlled with a control signal Charge_Ctrl_1 for controlling the first switch element SW11, to supply an electric charge to the capacitor C11.

At a time T3, the third switch element SW30 is controlled with a control signal Pulse_Ctrl for controlling the third switch element SW30, to generate a short-circuit current from the electric charge stored in the capacitor C11. As illustrated in FIGS. 2 and 4, current may flow to the laser diode LD12 in addition to the laser diode LD11 due to the parasitic capacitance and the parasitic inductor.

Similarly, at a time T5, current may flow to the laser diode LD11 and the laser diode LD1n in addition to the laser diode LD12 due to the parasitic capacitance and the parasitic inductor. Furthermore, a similar disadvantage arises at a time T7, a time T9, and so forth.

That is, the timing chart in FIG. 5 indicates that, when a desirable light emitting element is to be driven in a state with a parasitic capacitance and a parasitic inductance as illustrated in FIGS. 1 to 4, a light emitting element other than the desirable light emitting element is driven. This is not prevented by each diode D arranged to prevent occurrence of backflow and oscillation.

When a light emitting element other than the desirable light emitting element is driven, part of the electric charge originally intended to be supplied from the capacitor is not supplied to the desirable light emitting element and is distributed, thereby decreasing the emission efficiency of the desirable light emitting element. Since the emission efficiency decreases, the emission intensity decreases, and the measurable distance decreases.

The above-described disadvantage is one found by the inventor of the disclosure in the light emitting device according to the comparative example. In contrast, embodiments of the disclosure which are described below can address the disadvantage.

Embodiments

Embodiments of the disclosure are described below in detail referring to the drawings. In the following description, a first embodiment to a six embodiment are described in detail as examples of the embodiments of the disclosure.

Figure 6:
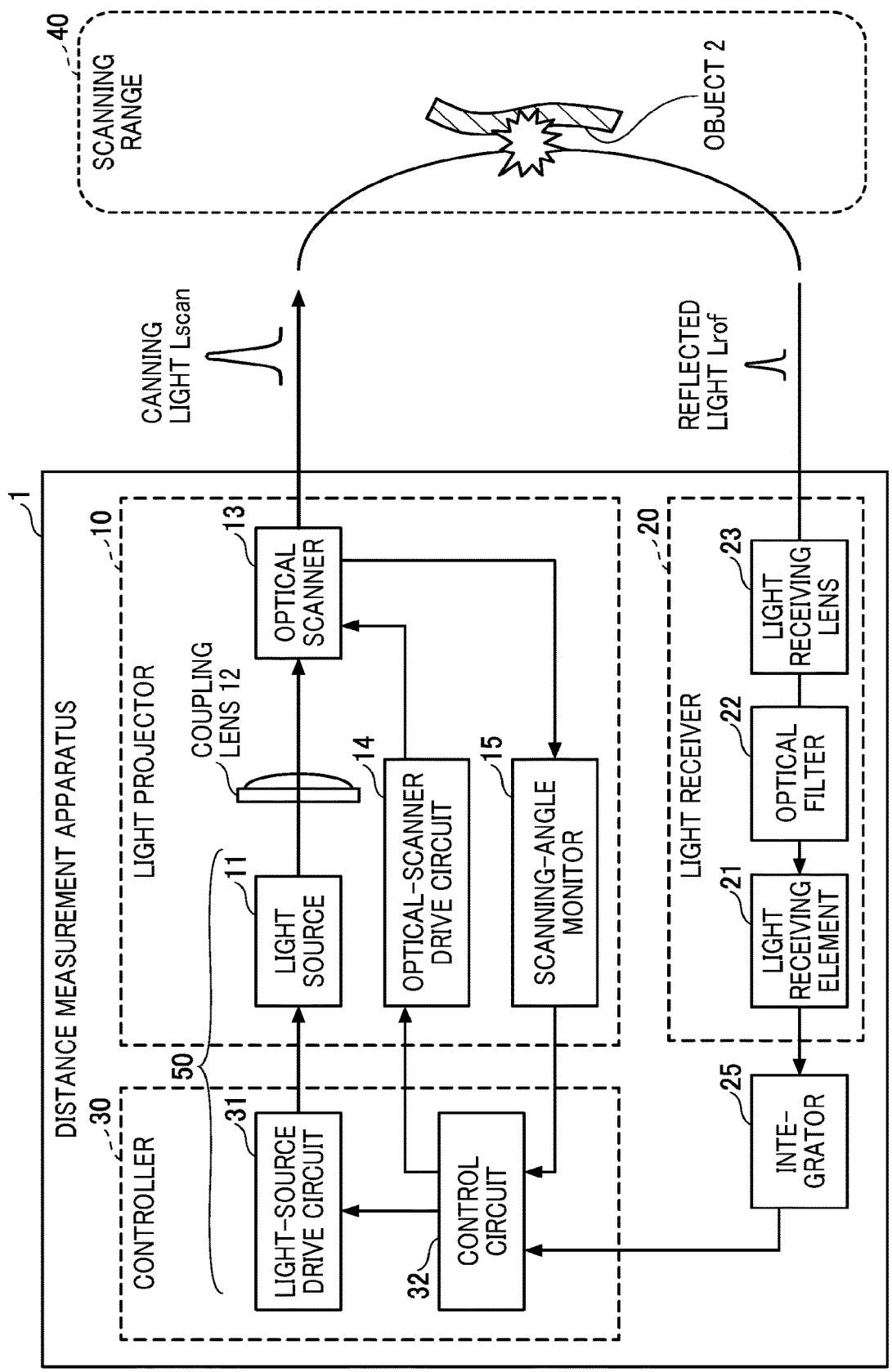
FIG. 6 is a functional block diagram illustrating a functional configuration of a distance measurement apparatus with a light emitting device according to each of embodiments of the disclosure installed.

The respective embodiments have mutually different circuit configurations for addressing the disadvantage; however, have a common presupposed device configuration. Hence, in the following description, the device configuration common to the respective embodiments is collectively described and then mutually different portions of the respective embodiments are individually described.
Device Configuration FIG. 6 is a functional block diagram illustrating a functional configuration of a distance measurement apparatus 1 with a light emitting device 50 according to an embodiment of the disclosure installed.

The distance measurement apparatus 1 includes a light projector 10 that projects light (scanning light Lscan) from a light source, a light receiver 20 that receives the reflected light (reflected light Lrof) from an object 2, an integrator 25 that time-integrates an output signal from the light receiver 20, and a controller 30 that performs control on the light projector 10 and distance measurement based on a reflection signal. In FIG. 6, the output of the light receiver 20 is coupled to the input of the integrator 25, and the time-integrated reflection signal is input to a control circuit 32 of the controller 30. However, it is not limited thereto. The integrator 25 may be included in the control circuit 32.

The light projector 10 and the light receiver 20 are typically arranged in a front section of a vehicle to detect an object existing at the front side of the vehicle. However, it is not limited thereto, and may be installed at any position of the vehicle, for example, to detect an object at a lateral side or the rear side of the vehicle.

The light projector 10 includes a light source 11, a coupling lens 12, an optical scanner 13, an optical-scanner drive circuit 14, and a scanning-angle monitor 15.

The light source 11 includes a plurality of light emitting element groups separately arranged in an optical scanning direction. Each light emitting element group includes a plurality of vertical cavity surface emitting lasers (VCSELs). The light source 11 is controlled by a light-source drive circuit 31 so that the light emitting element groups emit light at mutually independent light emitting timings. The control is based on a control signal output from the control circuit 32.

The light emitting device 50 according to each embodiment is implemented by the light source 11 and the light-source drive circuit 31.

The coupling lens 12 couples laser beams emitted from the light source 11 to the optical scanner 13. The optical scanner 13 performs scanning in an XZ plane by emitting the laser beams output from the plurality of light emitting element groups of the light source 11, to the same detection region. The scanning range of such scanning is illustrated as a scanning range 40. With the deflection of the laser beams given by the optical scanner 13, an object (in this case, an object 2) existing in a predetermined angular range is detected, and the distance to the detected object can be measured.

The scanning angle of the laser beams using the optical scanner 13 may be detected by the scanning-angle monitor 15 and supplied to the control circuit 32. In this case, the monitor result is fed back to an optical-scanner drive signal to control the scanning angle and the scanning frequency.

The light receiver 20 includes a light receiving element 21, an optical filter 22, and a light receiving lens 23. The light receiving lens 23 couples the laser beams reflected from an object existing in the beam scanning direction, to the light receiving element 21 via the optical filter 22.

The light receiving element 21 is implemented by, for example, a photodiode or an avalanche photodiode (APD). Another optical element such as a mirror may be arranged between the light receiving lens 23 and the light receiving element 21 in addition to the optical filter 22.

The light projector 10 and the light receiver 20 are closely arranged, and the optical axes of the light projector 10 and the light receiver 20 seem to be coaxial to each other when viewed at a position several meters away therefrom. The light reflected from an object to be detected is scattered in various directions at the reflection point. A light component that returns along the optical path equivalent to the optical path of the laser beams output from the distance measurement apparatus 1 is guided to the light receiving element 21 via the light receiving lens 23, and is detected as a reflection signal.

The light receiving element 21 outputs a photocurrent corresponding to the intensity of the input reflected light. The photocurrent output from the light deceiving element 21 is converted into a voltage signal and amplified by a transimpedance amplifier (not illustrated), and then the amplified voltage signal is input to the integrator 25. The integrator 25 integrates the detection signals of the light output from the plurality of light emitting element groups at different light emitting timings through single scanning and reflected by an object to be detected, and outputs the sum total value of the detection signals to the control circuit 32.

The control circuit 32 measures the distance to the detected object based on the period from when the drive timing signal of the light source is output to when the detection signal is acquired, that is, based on the difference between the time at which the laser beams are emitted and the time at which the reflected light is received.

With this configuration, the quality of the laser beams output from each light emitting element group is ensured, and the angular resolution of the laser beams is maintained high. In addition, by irradiating the same detection area with a plurality of laser beams at different timings, the light intensity in total is increased, and the measurable distance can be increased. By integrating the detection signals based on the reflected light, the detection signals can be acquired with a high signal to noise (S/N) ratio, and distance measurement with high accuracy can be performed.

The control circuit 32 may be implemented by an integrated circuit chip, such as a large-scale integrated (LSI) chip or a microprocessor; a logic device such as a field programmable gate array (FPGA); or a combination of the integrated circuit chip and the logic device.

Laser Source Configuration

Figure 7:
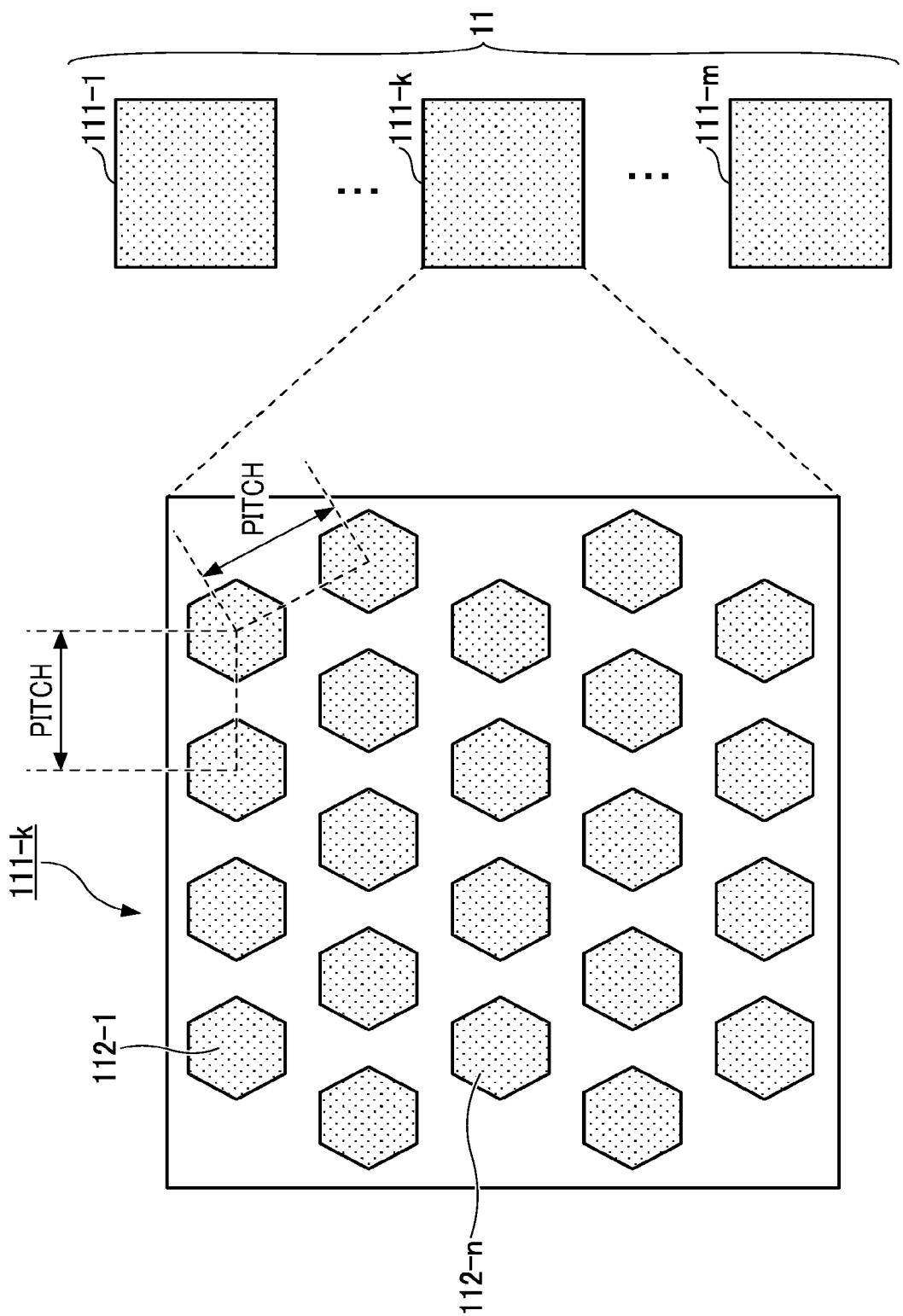
FIG. 7 schematically illustrates a configuration example of a laser light source.

FIG. 7 schematically illustrates a configuration example of the above-described light source 11. The light source 11 is formed of, for example, a vertical cavity surface emitting laser (VCSEL) array including a plurality of laser element groups, each of which is called "layer", are arranged in the same plane. The light source 11 has a plurality of layers 111 (a layer 111-1, . . . , a layer 111-k, . . . , and a layer 111-m). Each layer 111 includes a plurality of light emitting elements 112 (112-1 to 112-n). The respective light emitting elements 112 are elements that can be integrated on the same substrate. The optical axis of each light emitting element 112 is orthogonal to the plane in which the light source 11 is arranged.

The light emitting timings of the respective layers 111 are mutually independently controlled by the light-source drive circuit 31. Each layer 111 is controlled so that the plurality of light emitting elements 112 included in the layer 111 simultaneously emit light. Thus, in the following description, each "laser element group" forming each layer 111 of the light source 11 serves as one "light emitting element".

Referring to FIG. 7, the plurality of layers 111 are one-dimensionally arranged; however, the plurality of layers 111 may be two-dimensionally arranged. Moreover, the light emitting elements 112 of each layer 111 are closely arranged at a predetermined pitch or arranged in a honeycomb form; however, the arrangement of the light emitting elements 112 is not limited to the arrangement examples. The shape of the opening of each light emitting element 112 is not limited to a hexagon. That is, the number of the layers 111, the number of the light emitting elements 112 in each layer 111, the size of a light emitting region, and so forth, of the light source 11 are properly designed in accordance with the angular resolution, the scanning range, the detection distance, and so forth, required for the distance measurement apparatus 1.

As described above referring to FIG. 7, since the light emitting elements of the light source 11 are surface emitting lasers, the optical system can be downsized and hence the light emitting device 50 can be downsized. Moreover, since the layers 111 can be individually driven, the resolution can be increased. However, no limitation is intended thereby.

The light emitting elements of the light source 11 may be edge emitting lasers. In this case, high power is easily obtained and long distances can be measured.

Installation in Mobile Body

Figure 8:
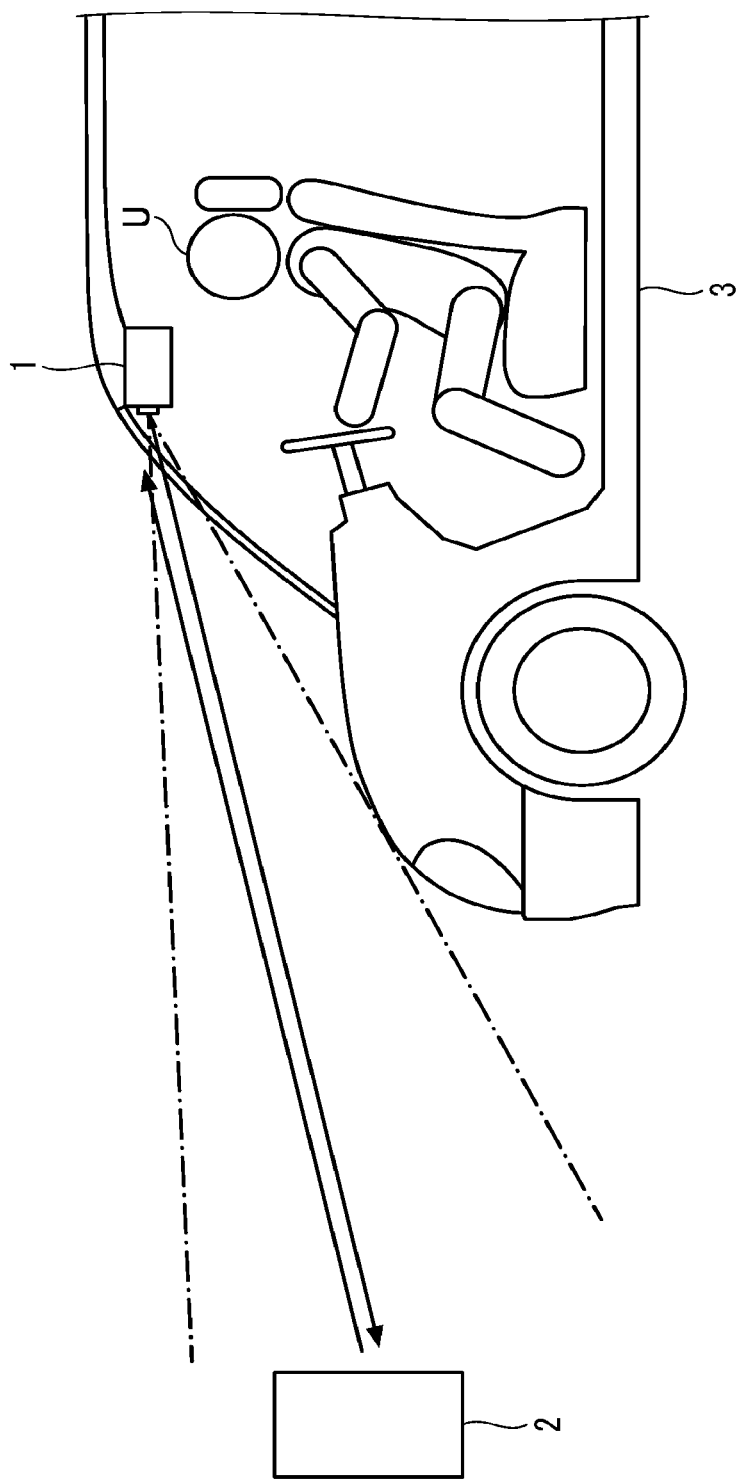
FIG. 8 schematically illustrates a case where the distance measurement apparatus is installed in a mobile body.

FIG. 8 schematically illustrates a case where the distance measurement apparatus 1 is installed in a mobile body (in this case, for example, an automobile 3 with a user U riding thereon). The distance measurement apparatus 1 is attached to an upper portion of a windshield or a ceiling portion above a front seat of the automobile 3.

The distance measurement apparatus 1 performs, for example, optical scanning in a travel direction of the automobile 3 and receives the reflected light from an object 2 existing in the travel direction to recognize the object 2. The light projector 10 of the distance measurement apparatus 1 performs optical scanning while restricting the angle of divergence of laser beams in advance by using an optical element such as a microlens array. Thus, the optical loss by a scanner such as the optical scanner 13 is decreased, and laser beams can be projected to a distant place with high angular resolution. Accordingly, for example, a leading vehicle or an obstruction existing on a drive lane can be discriminated, or a lane marker such as a white line or a Catseye (registered trademark) representing a lane division can be detected.

The installation position of the distance measurement apparatus 1 is not limited to an upper and front portion of the automobile 3, and may be installed at a side surface or a rear portion of the automobile 3. The distance measurement apparatus 1 is applicable to, without limited to a vehicle, any mobile body, for example, a flying body, such as an aircraft or a drone; or an autonomous mobile body such as a robot.

The device configuration common to the respective embodiments is collectively described above. Next, mutually different portions of the respective embodiments are individually described.

First Embodiment

Mount Form

Figure 9:
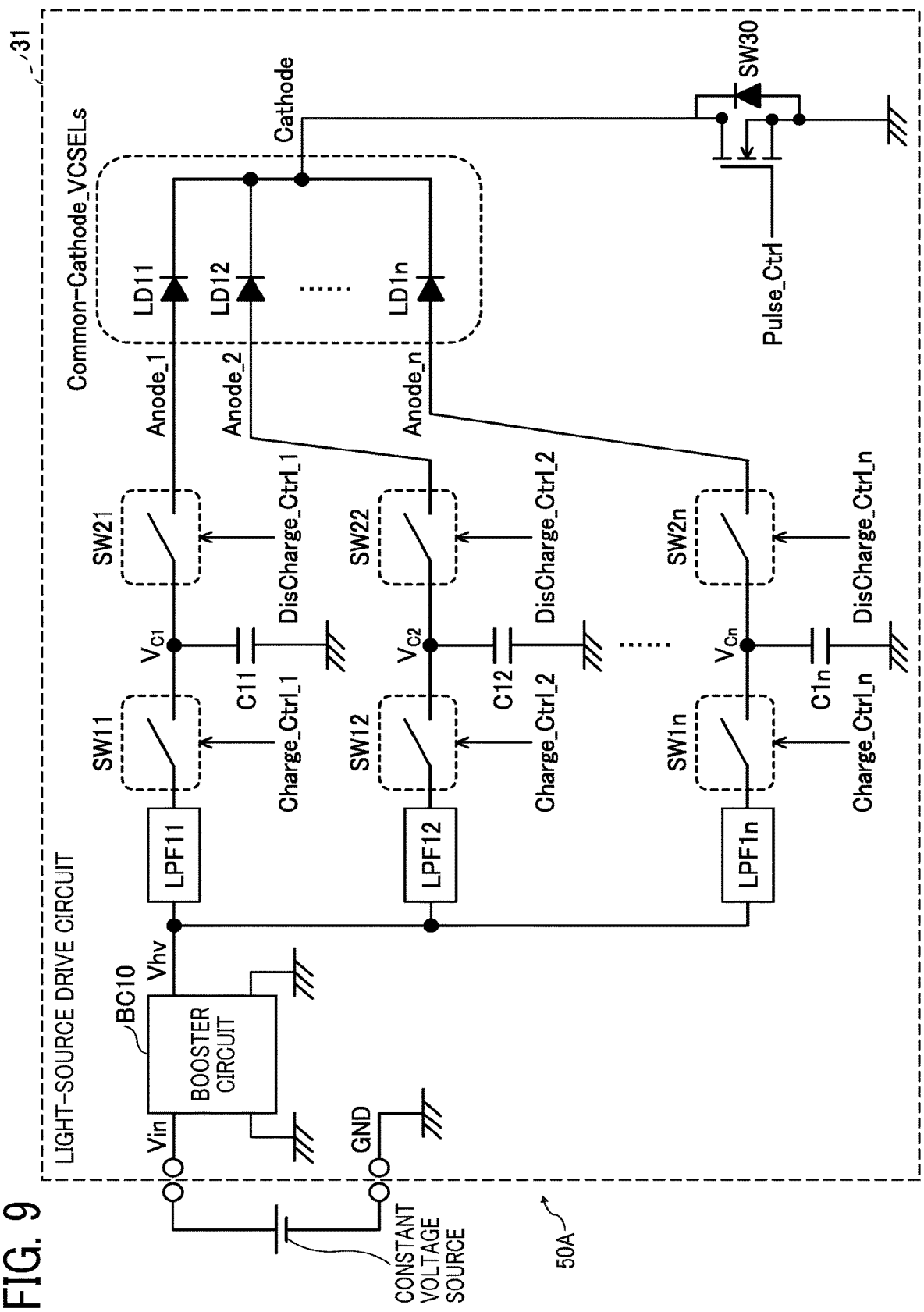
FIG. 9 is a circuit diagram illustrating a first mount form of a light emitting device according to a first embodiment of the disclosure.
Figure 10:
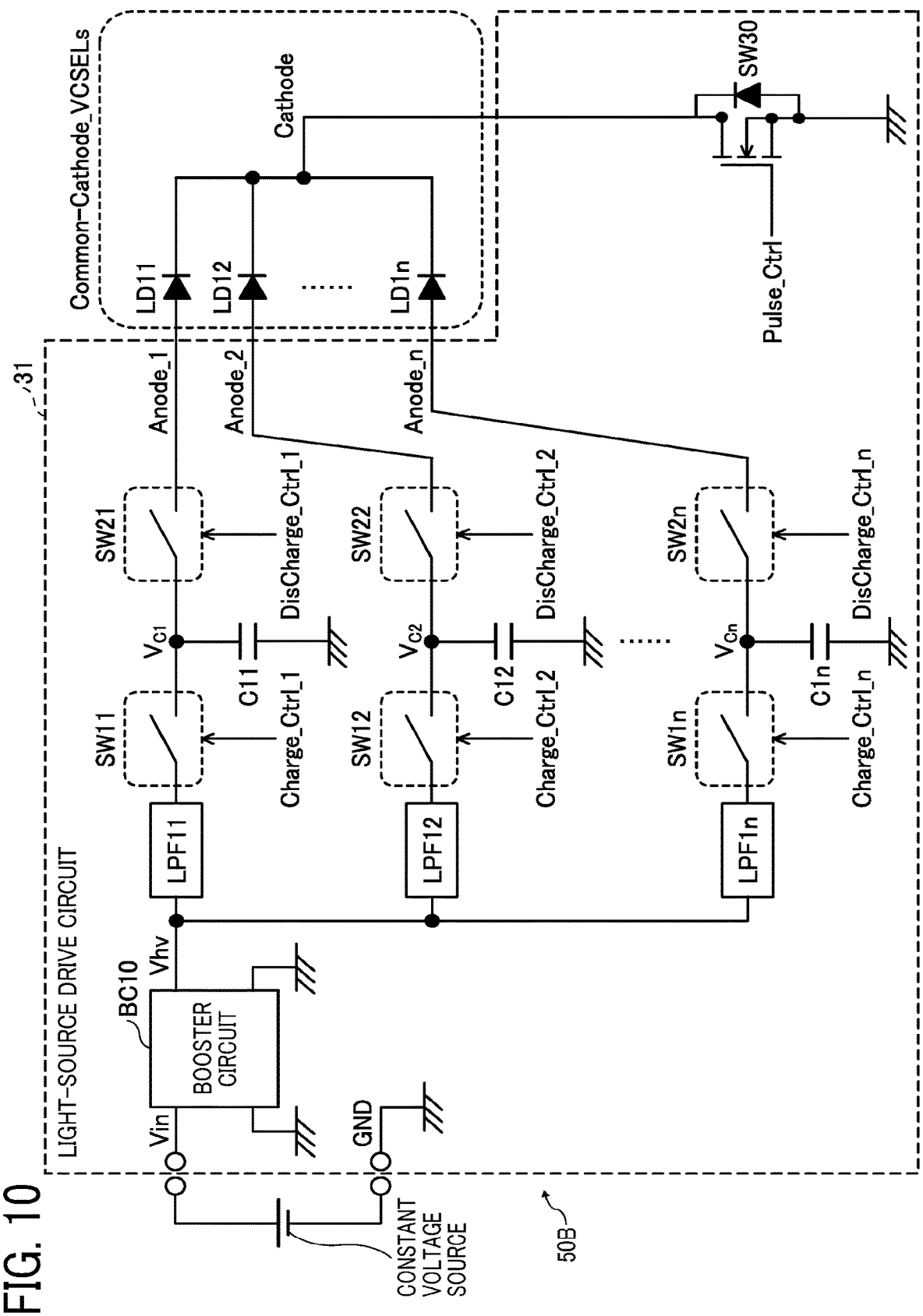
FIG. 10 is a circuit diagram illustrating a second mount form of the light emitting device according to the first embodiment of the disclosure.
Figure 11:
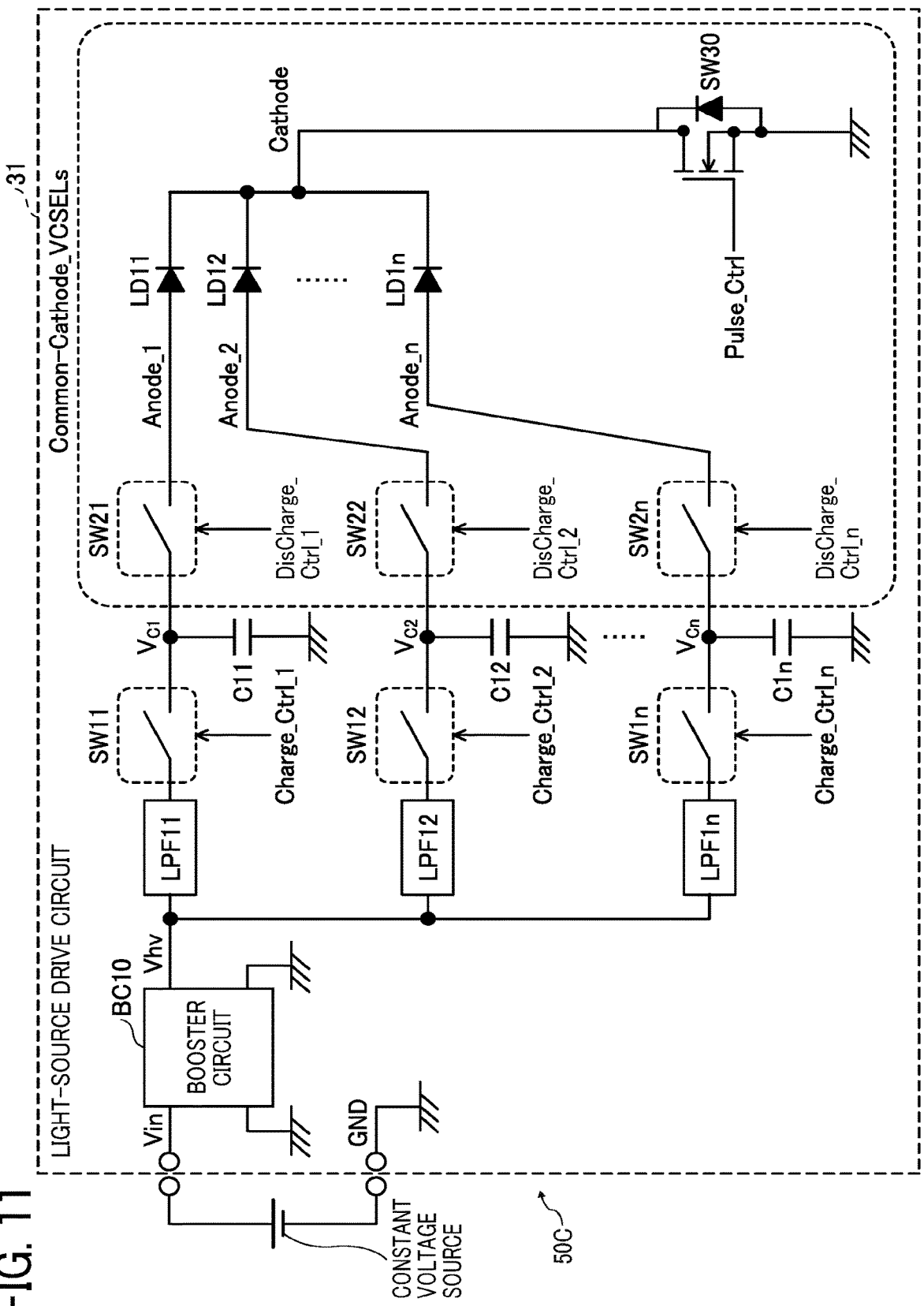
FIG. 11 is a circuit diagram illustrating a third mount form of the light emitting device according to the first embodiment of the disclosure.

A light emitting device 50 according to a first embodiment is described referring to FIGS. 9, 10, and 11. A light emitting device 50A, a light emitting device 50B, and a light emitting device 50C in the respective drawings have equivalent circuit configurations; however, have different mount forms.

Specifically, in the light emitting device 50A in FIG. 9, laser diodes LD serving as light emitting elements are directly mounted in the light-source drive circuit 31. In this case, the laser diodes LD may be mounted once on a package substrate made of ceramic and then the substrate may be mounted in the light-source drive circuit 31.

In the light emitting device 50B in FIG. 10, laser diodes LD are mounted outside the light-source drive circuit 31. In this case, the laser diodes LD are coupled to the light-source drive circuit 31 by soldering, or via a connector, a socket, or the like.

In the light emitting device 50C in FIG. 11, at least part of circuit components constituting the light-source drive circuit 31 and laser diodes LD are mounted once on a package substrate made of ceramic, and then the substrate is mounted in the light-source drive circuit 31.

As described above, the laser diodes (that is, the light source 11) and the light-source drive circuit 31 can be mounted in various forms in the light emitting device 50. This is likewise applied to the other embodiments without limited to this embodiment. In the following description, like the light emitting device 50A in FIG. 9, a case where laser diodes LD serving as light emitting elements are directly mounted in the light-source drive circuit 31 is described as an example.

Circuit Configuration

As illustrated in FIG. 9, the light emitting device 50A includes a booster circuit BC10, a plurality of low pass filters LPF (a low pass filter LPF11, a low pass filter LPF12, and a low pass filter LPF1n), a plurality of first switch elements SW (a first switch element SW11, a first switch element SW12, ..., and a first switch element SW1n), a plurality of capacitors C (a capacitor C11, a capacitor C12, ..., and a capacitor C1n), a plurality of second switch elements SW (a second switch element SW21, a second switch element SW22, ..., and a second switch element SW2n), a plurality of laser diodes LD (a laser diode LD11, a laser diode LD12, ..., and a laser diode LD1n), and a third switch element SW30. The illustration of a parasitic capacitance and a parasitic inductor is omitted.

As described above, the light emitting device 50A has a circuit configuration obtained by adding the plurality of second switch elements SW to the circuit configuration of the light emitting device 60 that is the light emitting device of the related art.

In the light emitting device 50A, when a first switch element SW is controlled and a capacitor C corresponding to one laser diode LD included in the plurality of laser diodes LD stores an electric charge to selectively turn on the laser diode LD, the second switch element SW that is coupled to a path through which an electric charge is supplied to a laser diode LD not to be turned on interrupts the path at least while an electric charge is supplied to the laser diode LD to be turned on. Thus, the above-described "disadvantage found by the inventor" can be addressed.

Hereinafter, the details of the circuit configuration of the light emitting device 50 and the reason why the disadvantage can be addressed are specifically described.

The light emitting device 50A receives a direct-current voltage Vin supplied from a constant voltage source, which is grounded (GND). Then, the booster circuit BC10 boosts the supplied direct-current voltage Vin, and outputs the boosted direct-current voltage as a direct-current voltage Vhv. The direct-current voltage Vhv is set, for example, in a range from 5 to 600 V in accordance with the current flowing to the light emitting element. Alternatively, the booster circuit BC10 may be omitted, and the direct-current voltage Vhv may be directly supplied from the constant voltage source.

The direct-current voltage Vhv passes through the low pass filters LPF (the low pass filter LPF11, the low pass filter LPF12, ..., and the low pass filter LPF1n), and is supplied to one ends of the first switch elements SW (the first switch element SW11, the first switch element SW12, ..., and the first switch element SW1n).

In this case, each low pass filter LPF is constituted by, for example, ferrite beads made of a material based on nickel zinc, manganese zinc, or iron; and a resistance-capacitance (R-C) circuit in which a resistor and a ceramic capacitor are combined.

Each first switch element SW uses, for example, an analog switch, a transistor, or a semiconductor switch, such as a metal oxide semiconductor field effect transistor (MOSFET) or a thyristor. However, no limitation is intended thereby. A mechanical switch may be used in accordance with the driving frequency of each laser diode LD serving as a light emitting element.

The control circuit 32 can charge a desirable capacitor C (the capacitor C11, the capacitor C12, ..., or the capacitor C1n) with electricity (that is, cause the desirable capacitor C to store an electric charge) by performing on/off control on the corresponding first switch element SW based on a control signal Charge_Ctrl (Charge_Ctrl_1, Charge_Ctrl_2, ..., or Charge_Ctrl_n).

When the charge is completed, the electric potential of the capacitor C is substantially equivalent to the electric potential of the direct-current voltage Vhv. The time constant of the time required for charging the capacitor C is determined based on the configuration of the low pass filter LPF located upstream of the capacitor C. Moreover, a resistor is added between the first switch element SW and the capacitor C if required. The time constant of the time required for charging the capacitor C is set to be shorter than the repetition period of driving for emitting light.

The capacitor C is desirably a ceramic capacitor having characteristics of low equivalent series inductance (ESL). The capacity of the capacitor is properly determined based on the output current value or the pulse width. Each capacitor C is coupled to one end of corresponding one of the second switch elements SW (SW21, SW22, ..., and SW2n).

Each second switch element SW uses, for example, a semiconductor switch, such as a MOSFET, a gallium nitride field effect transistor (GaNFET), or a micro electro mechanical systems (MEMS) switch. Since the semiconductor switch is used, the loss during off (during interruption) can be reduced. Moreover, since the semiconductor switch is used, on and off can be switched at high speed.

However, no limitation is intended thereby. A mechanical switch may be used in accordance with the driving frequency of each laser diode LD serving as a light emitting element. For example, a mechanical switch is used for frequencies of about several hertz, a MOSFET or MEMS switch is used for frequencies in a range from several kilohertz to several tens of megahertz, and a GaNFET is used for frequencies in a range from several tens of megahertz to several hundreds of megahertz. The mechanical switch or MEMS switch can completely turn off (interrupt) the circuit, thereby having an advantage of decreasing the parasitic capacitance of the switch element.

The responsivity of the output current can be increased by decreasing the inductance of the wiring that couples the capacitor C to the second switch element SW. Thus, the wiring inductance is desirably as small as possible. For example, the design is desirably made so that the wiring inductance is 3 nH or less. When low inductance is not ensured in the layout of such components, for example, a countermeasure can be employed such as increasing the voltage of the direct-current voltage Vhv or selecting a capacitor with high ESR.

The second switch elements SW are coupled to anodes (Anode 1, Anode 2, ..., and Anode n) of the respective laser diodes LD (the laser diode LD1, the laser diode LD2, ..., and the laser diode LDn) serving as light emitting elements. The third switch element SW30 is coupled to a cathode of the laser diodes LD.

The third switch element SW30 uses a MOSFET or a GaNFET whose gate-source capacity is 1 nC or less.

The laser diodes LD use, for example, VCSELs having a common cathode (Common-Cathode_VCSELs). For example, VCSELs including 40 light emitting elements in an array are used.

The control circuit 32 performs control to drive a desirable light emitting element by performing on/off control on the corresponding second switch element SW based on a control signal DisCharge_Ctrl (DisCharge_Ctrl_1, DisCharge_Ctrl_2, ..., or DisCharge_Ctrl_n).

Moreover, likewise, the control circuit 32 performs control to drive a desirable light emitting element by performing on/off control on the third switch element SW30 based on a control signal Pulse_Ctrl.

Control Timings

Figure 12:
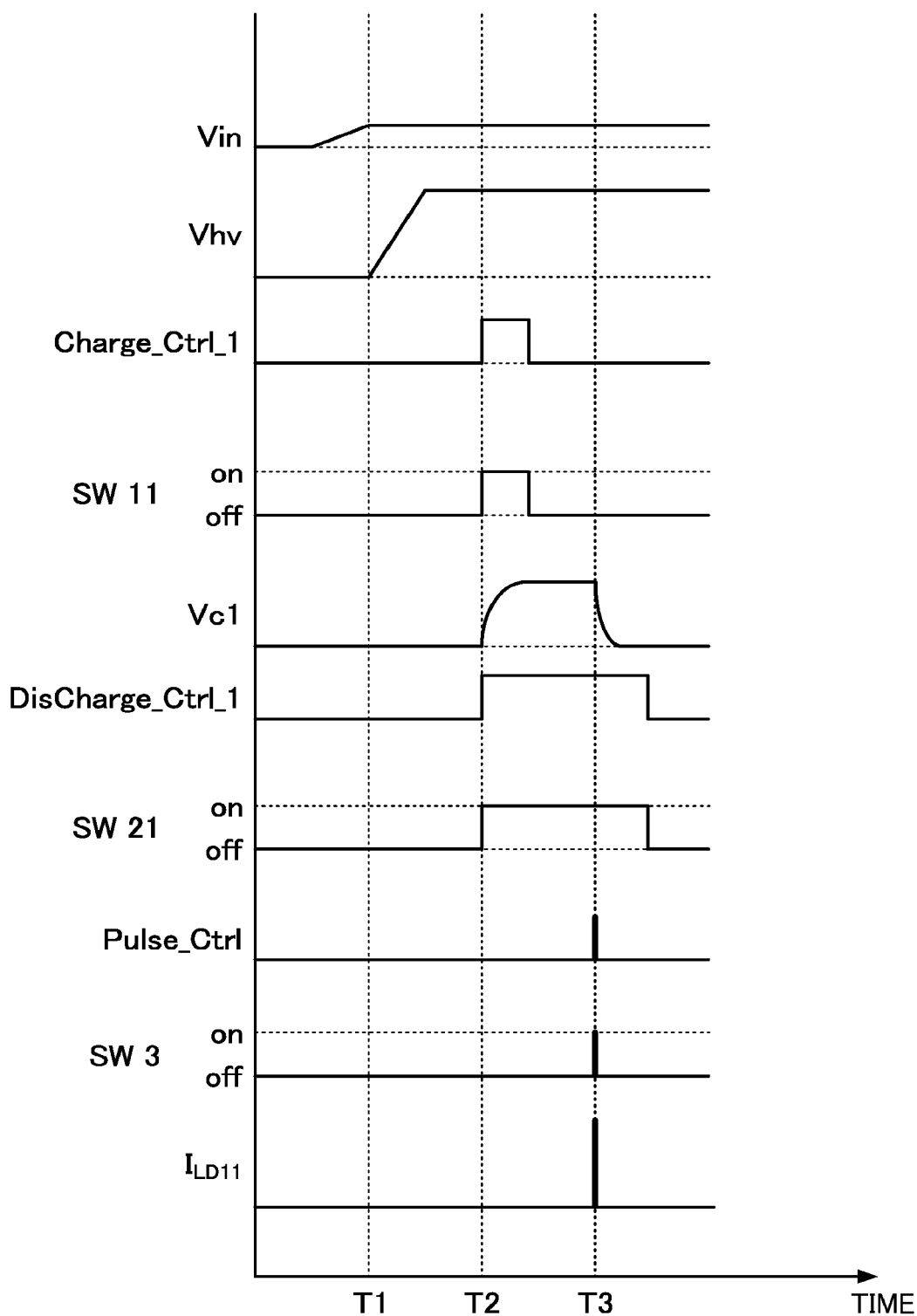
FIG. 12 is a timing chart illustrating control timings for driving a light emitting element according to each of the embodiments of the disclosure.
Figure 13:
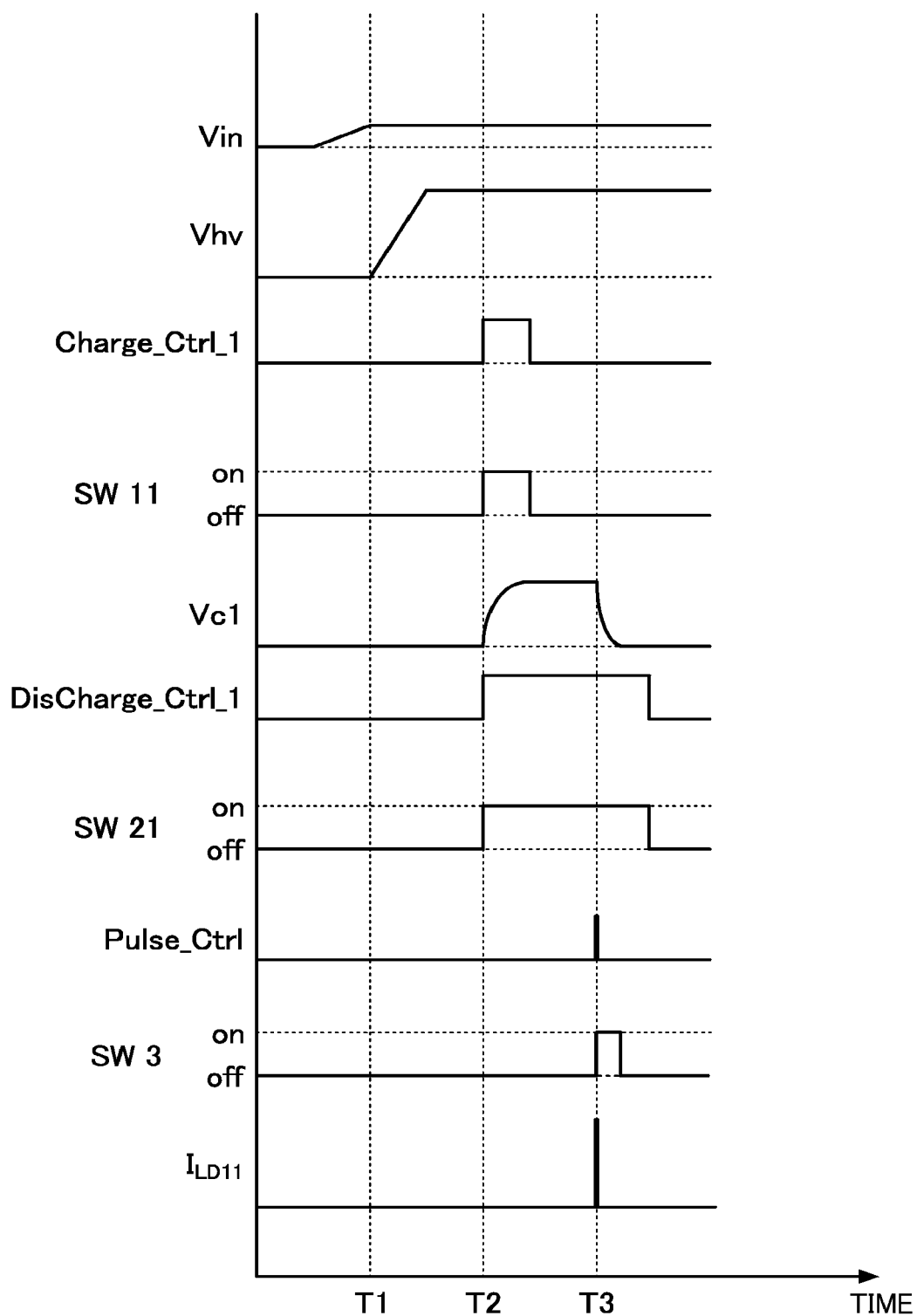
FIG. 13 is a timing chart illustrating control timings for driving a light emitting element according to each of the embodiments of the disclosure.
Figure 14:
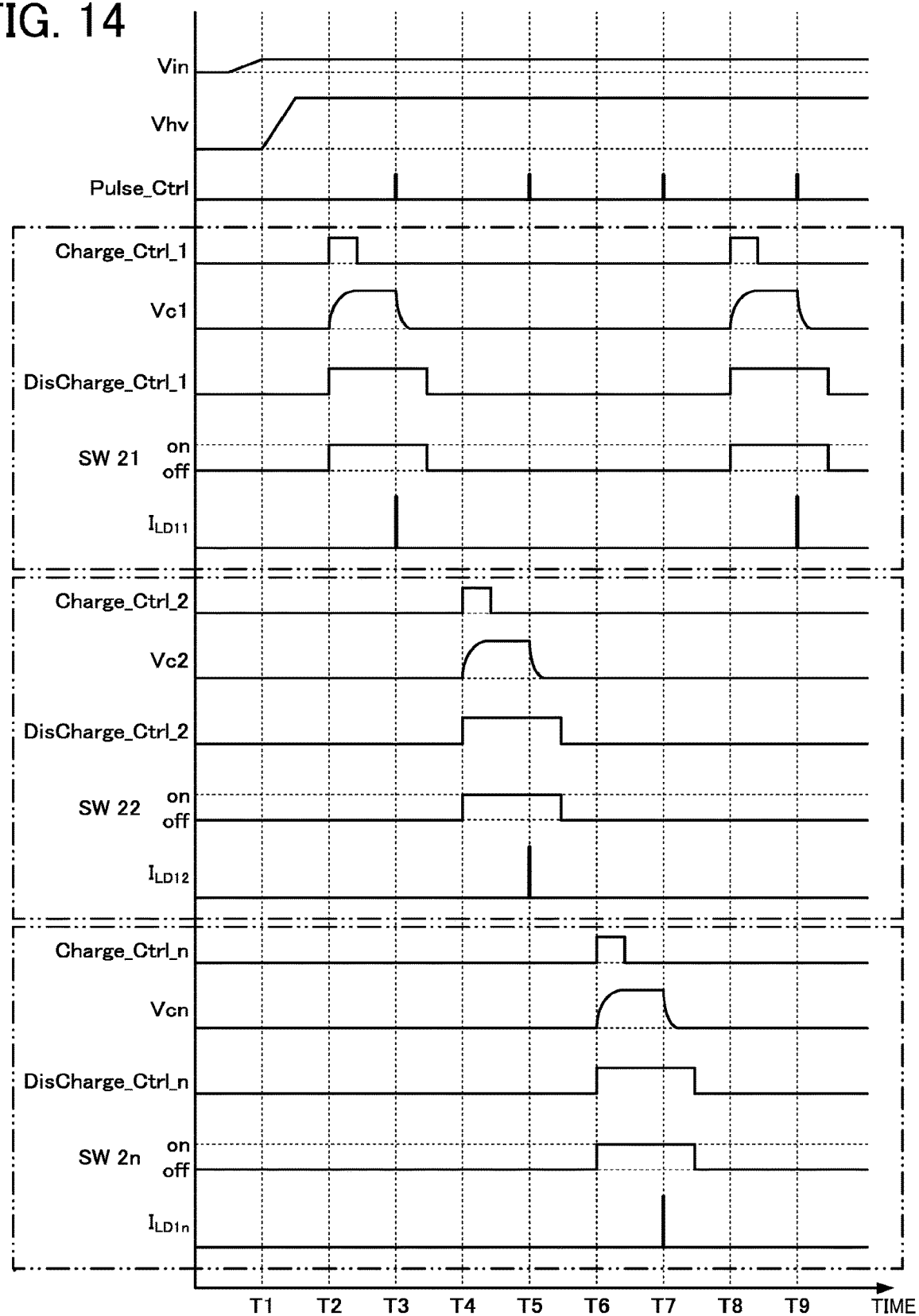
FIG. 14 is a timing chart illustrating control timings for driving a light emitting element according to each of the embodiments of the disclosure.

Next, control timings for driving a light emitting element are described referring to FIGS. 12, 13, and 14. FIGS. 12, 13, and 14 are timing charts illustrating control timings for driving a light emitting element.

Referring to FIG. 12, control timings for driving a desirable light emitting element with short pulse are described. A case is expected in FIG. 12 where the desirable light emitting element is the laser diode LD11 and an electric charge is supplied to the corresponding capacitor C with a voltage of 100 V or less.

The supply of the direct-current voltage Vhv is started at a time T1 in response to the supply of the direct-current voltage Vin.

When the direct-current voltage Vhv becomes stable, at a time T2, the first switch element SW11 is turned on with a control signal Charge_Ctrl_1. When the first switch element SW11 is turned on, the capacitor C11 stores an electric charge. Reference sign Vc1 in FIG. 12 indicates the voltage of the capacitor C11. When the charge is completed, the electric potential of the voltage Vc1 is substantially equivalent to the electric potential of the direct-current voltage Vhv. The time constant of the time required for charging the capacitor C is determined based on the configuration of the low pass filter LPF located upstream of the capacitor C as described above. As soon as the charge is completed, the first switch element SW11 is turned off. When the first switch element SW11 is turned off, the electric charge stored in the capacitor C11 decreases over time. Owing to this, the first switch element SW11 is desirably continuously turned on until immediately before a time T3 comes (described later).

At the time T2, the second switch element SW21 is turned on with a control signal DisCharge_Ctrl_1.

In FIG. 12, the second switch element SW21 and the first switch element SW11 are controlled at the same timing. However, no limitation is intended thereby. The control on the second switch element SW21 to be turned on may be performed at a timing before or after the control on the first switch element SW11 to be turned on.

When the capacitor C11 stores an electric charge and the second switch element SW21, which is in the circuit loop including the capacitor C11, is on, the time T3 comes. At the time T3, the third switch element SW30 is turned on by the control signal Pulse_Ctrl.

Then, a pulse current is output to the laser diode LD11 while the electric charge of the capacitor C11 serves as a supply source. When an electric charge is supplied, the electric charge stored in the capacitor C11 is reduced and the voltage Vc1 of the capacitor C11 is decreased.

In this case, a second switch element SW (for example, the second switch element SW22) other than the second switch element SW21 is off (the interrupting state). Thus, a pulse current does not flow to another laser diode LD (for example, the laser diode LD12) other than the laser diode LD11. As described above, with the light emitting device 50A, an electric charge stored in a desirable light emitting element can be supplied only to a desirable light emitting element. Accordingly, the emission efficiency of the desirable light emitting element can be increased. In this case, the number of desirable light emitting elements is not limited. For example, one light emitting element (in the above-described example, corresponding to the laser diode LD11) may serve as a desirable light emitting element, and the one light emitting element may emit light like the above-described example. Alternatively, two or more light emitting elements may serve as desirable light emitting elements, and the two or more light emitting elements may emit light simultaneously. Still alternatively, the number of desirable light emitting elements may be changed every emission of light.

When a desirable light emitting element is individually driven, an electric charge can be prevented from flowing to another light emitting element (another laser diode LD), and the above-described "disadvantage found by the inventor" can be addressed.

Accordingly, with the distance measurement apparatus 1 with the light emitting device 50A according to this embodiment installed, since the emission efficiency of a light emitting element is prevented from decreasing, the emission intensity does not decrease, and the measurable distance is prevented from decreasing. Thus, sensing accuracy is increased.

FIG. 13 illustrates a case where an electric charge is supplied to the capacitor C11 with a high voltage in a range from 100 to 600 V. The case corresponds to a case where the voltage of the capacitor C11 is increased more than the case in FIG. 12, to decrease the time constant at rising of the output current. In this case, at the time T3, the period in which the third switch element SW30 is on may be longer than the period in FIG. 12. The other situations are similar to those in the case in FIG. 12. Thus, even in the case where an electric charge is supplied to the capacitor C11 with a high voltage in a range from 100 to 600 V as illustrated in FIG. 13, the above-described "disadvantage found by the inventor" can be addressed similarly to the case in FIG. 12.

Next, referring to FIG. 14, control timings for individually driving the respective laser diodes LD, which are control timings for sequentially driving the respective laser diodes LD are described. Referring to FIG. 14, a case where the laser diodes LD are driven in the order of the laser diode LD11, the laser diode LD12, the laser diode LD1$n$, and the laser diode LD11 is described as an example. The case is merely an example, the order to be turned on does not have to be the sequential order, and may be a desirable order. The plurality of laser diodes LD11 may be individually driven.

A time T1, a time T2, and a time T3 are similar to those of the control timings described above referring to FIG. 13.

At a time T4 and a time T5, the control targets at the time T2 and the time T3 are switched from the first switch element SW11 to the first switch element SW12, from the capacitor C11 to the capacitor C12, and from the second switch element SW21 to the second switch element SW22. The control timings of the control targets at the time T4 and the time T5 are similar to those at the time T2 and the time T3.

At a time T6 and a time T7, the control targets at the time T2 and the time T3 are switched from the first switch element SW11 to the first switch element SW1$n$, from the capacitor C11 to the capacitor C1$n$, and from the second switch element SW21 to the second switch element SW2$n$. The control timings of the control targets at the time T6 and the time T7 are similar to those at the time T2 and the time T3.

At a time T8 and a time T9, the control targets and the control timings are similar to those at the time T2 and the time T3.

At any time T, another second switch element SW other than the second switch element SW21 coupled to the laser diode LD to be driven is off (the interrupting state). Thus, a pulse current does not flow to another laser diode LD other than the laser diode LD to be driven. By using this, only control with the control signal Charge_ctrl may be precedently performed in accordance with the time required for charging the capacitor C. Accordingly, in a case where the period of one cycle in which the respective laser diodes LD are individually sequentially driven is a short period, the precedent control with the control signal Charge_ctrl can accommodate such a situation in which the time required for charging the capacitor C is insufficient for next emission.

Thus, even when each light emitting element is individually driven, an electric charge can be prevented from flowing to another light emitting element (another laser diode LD), and the above-described "disadvantage found by the inventor" can be addressed, similarly to the above-described case referring to FIG. 12.

Second Embodiment

Figure 15:
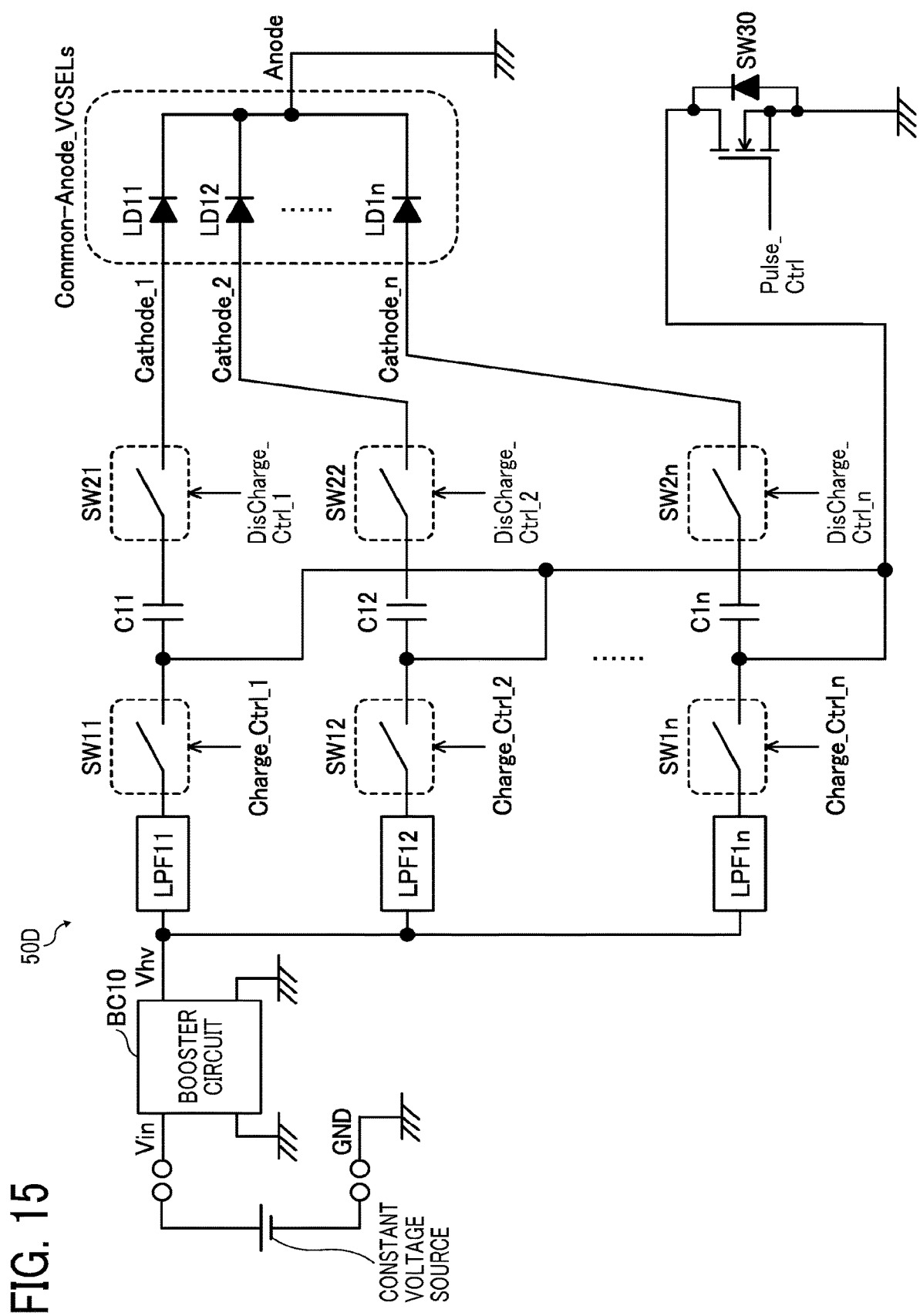
FIG. 15 is a circuit diagram illustrating a light emitting device according to a second embodiment of the disclosure.

The circuit configuration of a light emitting device 50D according to a second embodiment is described referring to FIG. 15. The redundant description is omitted for the contents common to those of the first embodiment. The redundant description is omitted similarly in embodiments which will be described later.

In the above-described light emitting device 50A according to the above-described first embodiment, the laser diodes LD serving as light emitting elements which are coupled to one another in an array have a common cathode. In contrast, in the light emitting device 50D according to the second embodiment illustrated in FIG. 15, laser diodes LD serving as light emitting elements which are coupled to one another in an array have a common anode. Even in such a case of the common anode, a disadvantage similar to the above-described "disadvantage found by the inventor" arises due to the above-described parasitic capacitance or parasitic inductor.

However, according to this embodiment, even in the case of the common anode, an electric charge can be prevented from flowing to another light emitting element (another laser diode LD), and the above-described "disadvantage found by the inventor" can be addressed.

Specifically, switch elements SW are arranged in series with respect to corresponding capacitors C that store electric charges and corresponding laser diodes LD. Then the switch elements SW are controlled at control timings similar to the control timings described above with reference to FIGS. 12, 13, and 14.

Thus, an electric charge can be prevented from flowing to another light emitting element (another laser diode LD), and the above-described "disadvantage found by the inventor" can be addressed, similarly to the case described above referring to FIGS. 12, 13, and 14.

Moreover, with this embodiment, since the anode side is grounded, the voltage of the laser diode LD can be easily measured and used with reference to the ground position. Furthermore, with this embodiment, since the anode side is grounded, a load can be prevented from actuating due to a short-circuit failure.

Third Embodiment

Figure 16:
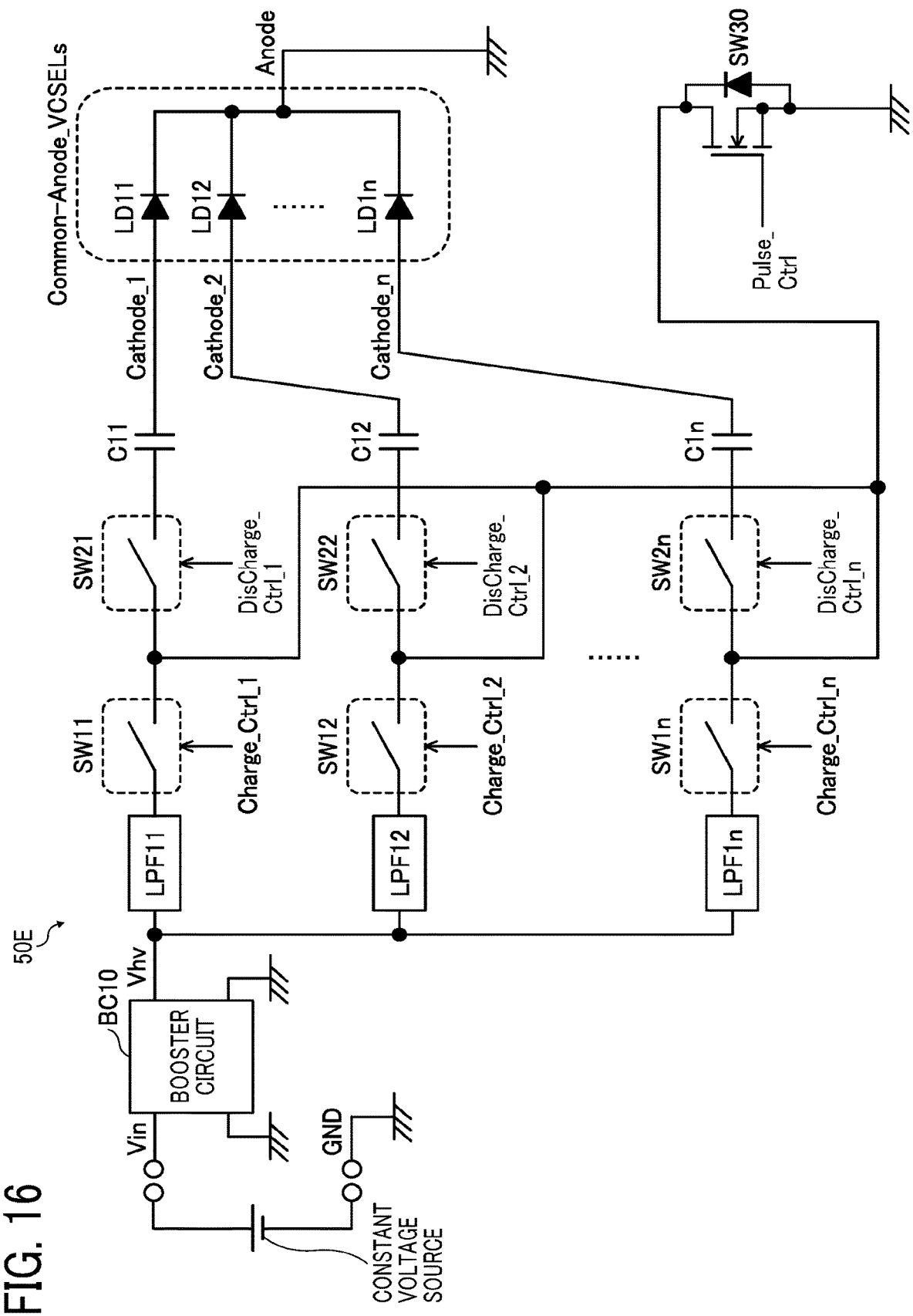
FIG. 16 is a circuit diagram illustrating a light emitting device according to a third embodiment of the disclosure.

The circuit configuration of a light emitting device 50E according to a third embodiment is described referring to FIG. 16. According to this embodiment, similarly to the above-described second embodiment, laser diodes LD have a common anode. This embodiment differs from the second embodiment in that while each second switch element SW is arranged between a corresponding capacitor C and a corresponding laser diode LD according to the second embodiment, each capacitor C is arranged between a corresponding second switch element SW and a corresponding laser diode LD according to this embodiment.

Thus, even with the configuration of this embodiment, by controlling the respective switch elements at control timings similar to the control timings described above referring to FIGS. 12, 13, and 14, the above-described "disadvantage found by the inventor" can be addressed.

Fourth Embodiment

Figure 17:
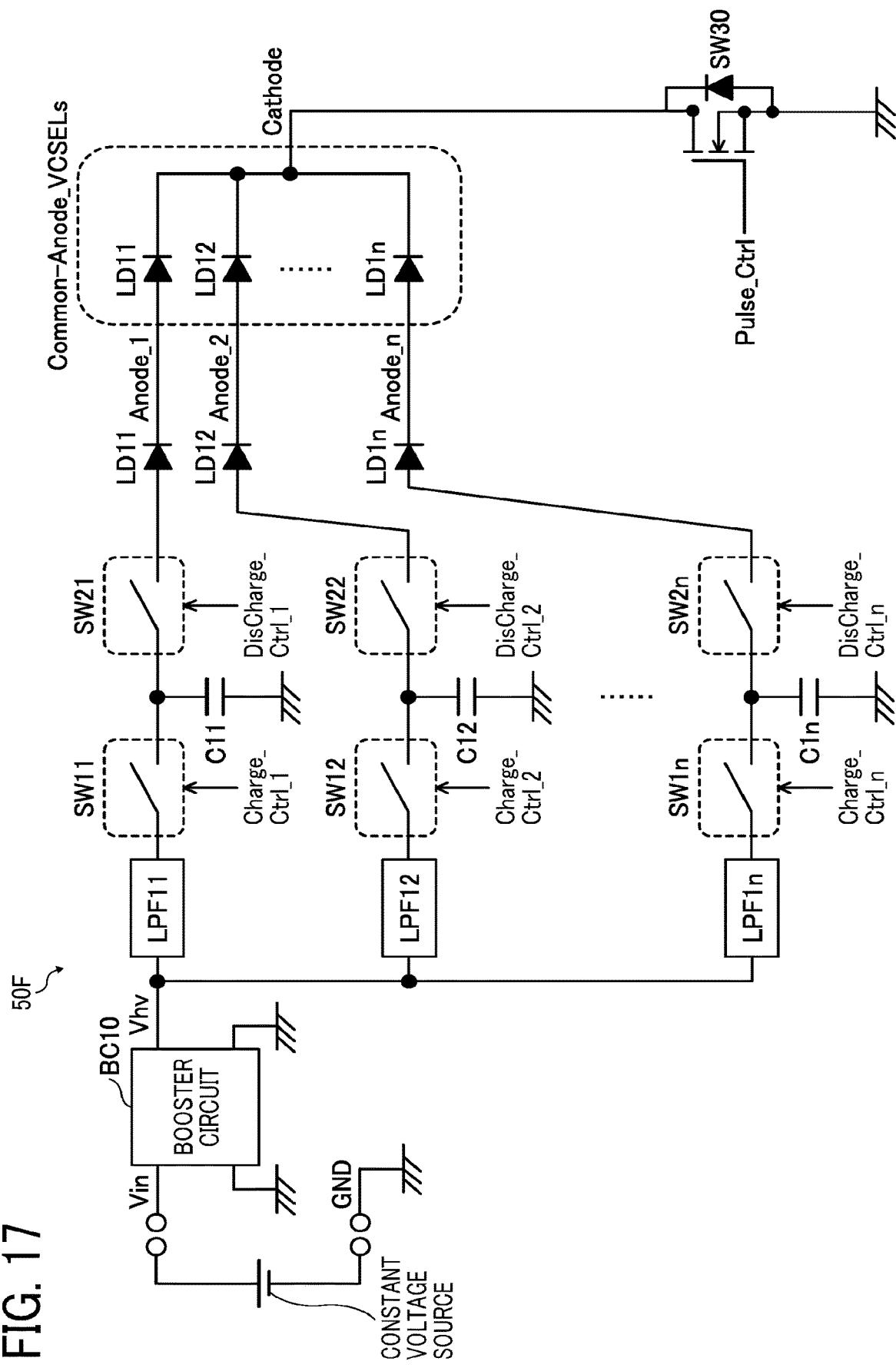
FIG. 17 is a circuit diagram illustrating a light emitting device according to a fourth embodiment of the disclosure.

The circuit configuration of a light emitting device 50F according to a fourth embodiment is described referring to FIG. 17. In this embodiment, similarly to the above-described first embodiment, laser diodes LD have a common cathode. However, this embodiment differs from the first embodiment in that each diode D is arranged between a corresponding second switch element SW and a corresponding laser diode LD. The diode D is arranged to prevent occurrence of backflow and oscillation.

That is, according to this embodiment, similarly to the above-described embodiments, the above-described "disadvantage found by the inventor" can be addressed, and backflow current and oscillation after driving current has passed through each laser diode LD can be prevented from occurring. Accordingly, a surge voltage that is generated at both ends of each laser diode LD can be decreased, a failure or a malfunction can be prevented from occurring, and stability can be increased.

Fifth Embodiment

Figure 18:
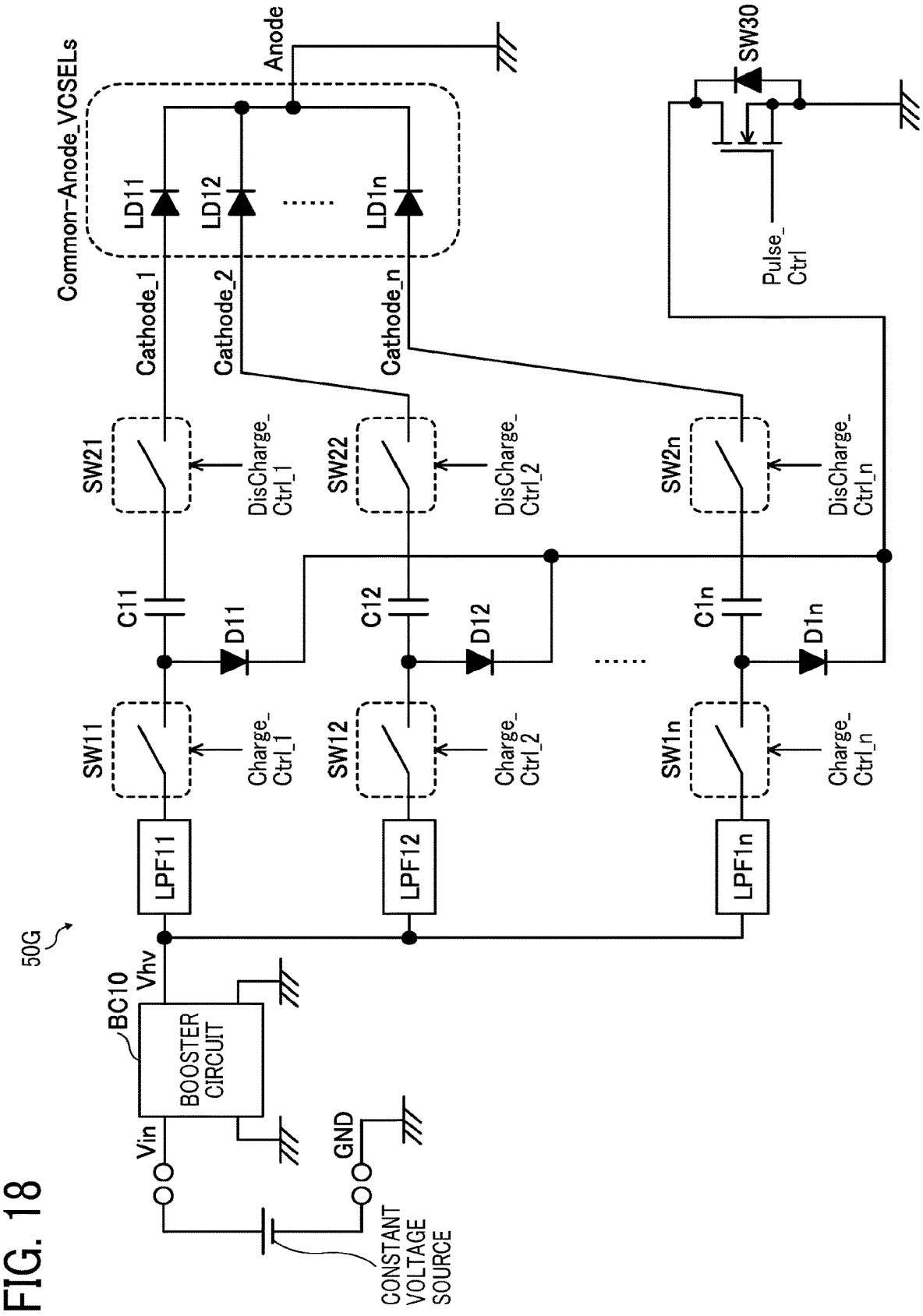
FIG. 18 is a circuit diagram illustrating a light emitting device according to a fifth embodiment of the disclosure.

The circuit configuration of a light emitting device 50G according to a fifth embodiment is described referring to FIG. 18. This embodiment has a configuration similar to that of the above-described second embodiment. However, this embodiment differs from the second embodiment in that each capacitor C, a corresponding second switch element SW, and a corresponding laser diode LD are coupled in series; and each diode D is coupled in parallel to a corresponding capacitor C, a corresponding second switch element SW, and a corresponding laser diode LD. The diode D is arranged to prevent occurrence of backflow and oscillation.

That is, according to this embodiment, similarly to the above-described embodiments, the above-described "disadvantage found by the inventor" can be addressed, and backflow current and oscillation after driving current has passed through each laser diode LD can be prevented from occurring. Accordingly, a surge voltage that is generated at both ends of each laser diode LD can be decreased, a failure or a malfunction can be prevented from occurring, and stability can be increased.

Sixth Embodiment

Figure 19:
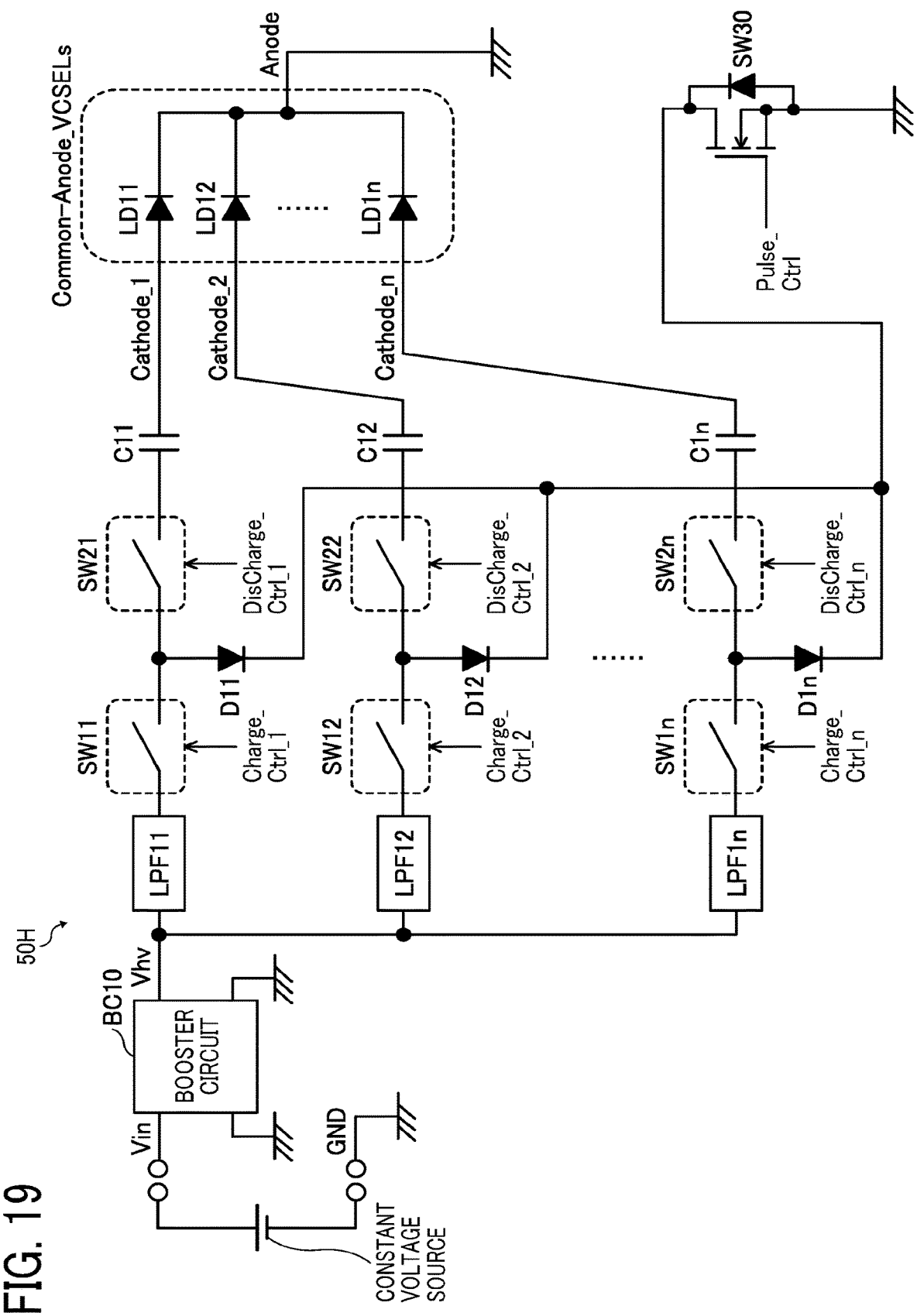
FIG. 19 is a circuit diagram illustrating a light emitting device according to a sixth embodiment of the disclosure.

The circuit configuration of a light emitting device 50H according to a sixth embodiment is described referring to FIG. 19. This embodiment has a configuration similar to that of the above-described third embodiment. However, this embodiment differs from the third embodiment in that each second switch element SW, a corresponding capacitor C, and a corresponding laser diode LD are coupled in series; and each diode D is coupled in parallel to a corresponding second switch element SW, a corresponding capacitor C, and a corresponding laser diode LD. The diode D is arranged to prevent occurrence of backflow and oscillation.

That is, according to this embodiment, similarly to the above-described embodiments, the above-described "disadvantage found by the inventor" can be addressed, and backflow current and oscillation after driving current has passed through each laser diode LD can be prevented from occurring. Accordingly, a surge voltage that is generated at both ends of each laser diode LD can be decreased, a failure or a malfunction can be prevented from occurring, and stability can be increased.

Seventh Embodiment

Figure 20:
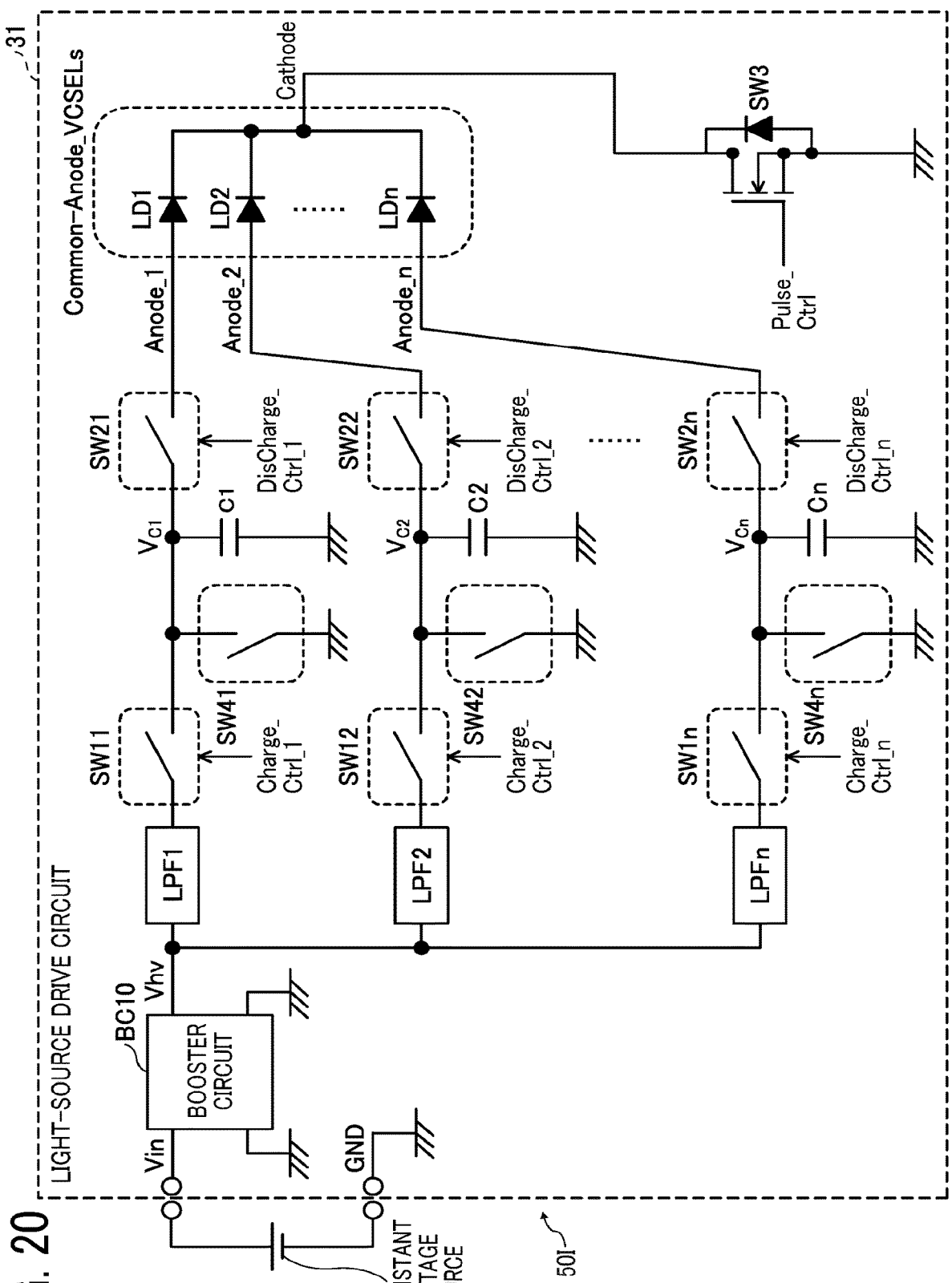
FIG. 20 is a circuit diagram illustrating a light emitting device according to a seventh embodiment of the disclosure.

FIG. 20 is a circuit diagram illustrating a light emitting device 501 according to a seventh embodiment of the disclosure. As illustrated in FIG. 20, the light emitting device 501 according to this embodiment differs from the light emitting device 50A according to the first embodiment illustrated in FIG. 9 in that a plurality of fourth switch elements SW4 (switches SW41, SW42, . . . , and SW4n) are provided in parallel to a plurality of capacitors C (capacitors C1, C2, . . . , and Cn), respectively. In the light emitting device 501 according to this embodiment, when one laser diode LD among the plurality of laser diodes LD emits light, the fourth switch element SW4 coupled to the capacitor C corresponding to another laser diode LD is turned on, and hence the capacitor C corresponding to the other laser diode LD can be discharged.

Figure 21:
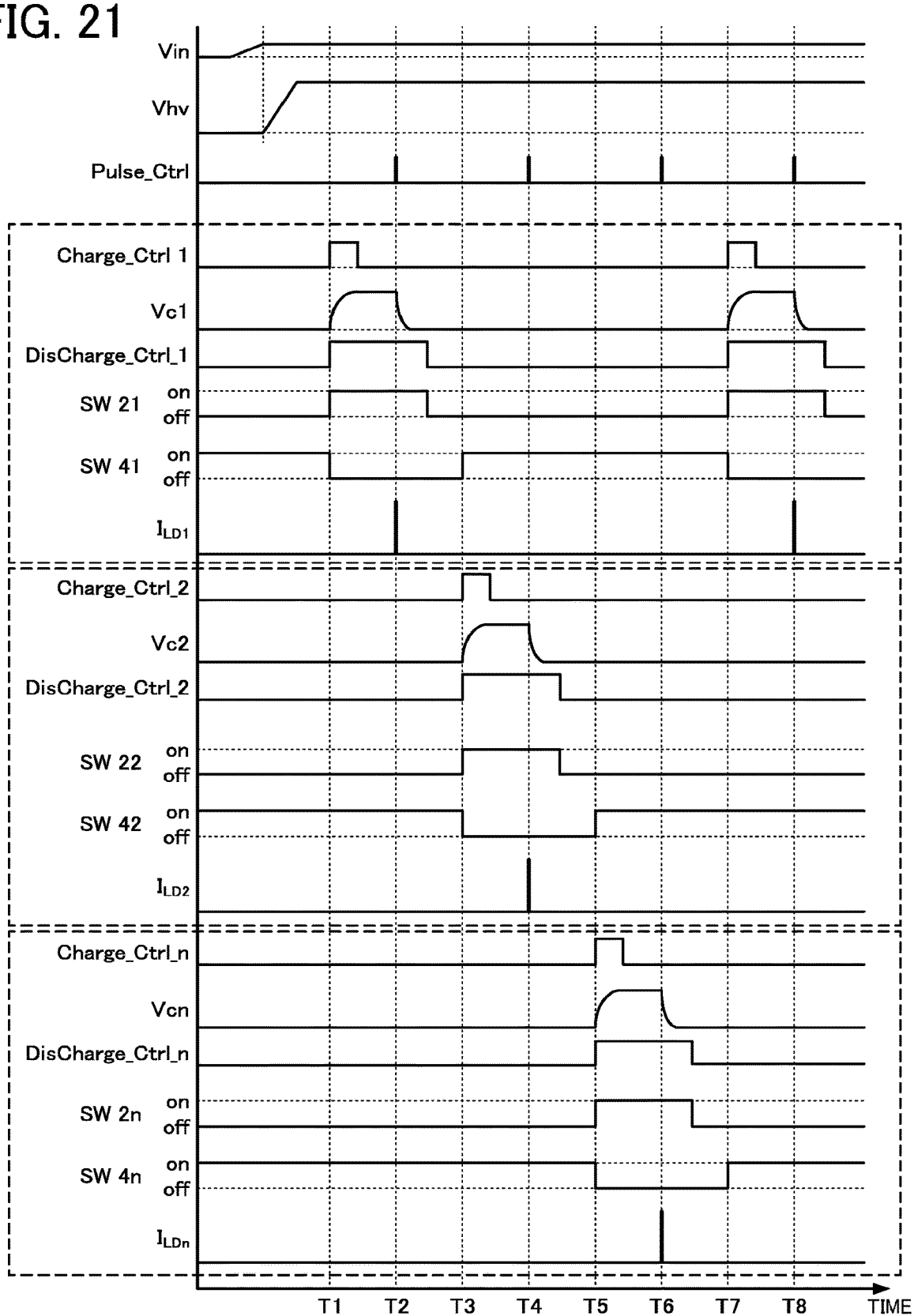
FIG. 21 is a timing chart illustrating various operation timings in the light emitting device according to the seventh embodiment of the disclosure.

FIG. 21 is a timing chart illustrating various operation timings in the light emitting device 501 according to the seventh embodiment of the disclosure. As illustrated in FIG. 21, in the light emitting device 501 according to this embodiment, while a certain laser diode LD emits light, the fourth switch element SW4 coupled in parallel to the capacitor C corresponding to the laser diode LD is turned off, and the fourth switch element SW4 coupled in parallel to the capacitor C corresponding to another laser diode LD is turned on. In the light emitting device 501 according to this embodiment, while a certain laser diode LD emits light, the capacitor C corresponding to another laser diode LD is grounded, and hence the voltage of the capacitor C corresponding to the other laser diode LD can be reliably set to 0 V.

For example, at a time T6 illustrated in FIG. 21, a laser diode LDn is emitting light, and the other laser diodes LD1 and LD2 are not emitting light. In this case, in the light emitting device 501 according to this embodiment, the fourth switch element SW4n coupled in parallel to the capacitor Cn corresponding to the laser diode LDn which is emitting light is turned off for a preset period (from a time T5 to a time T7), and the fourth switch elements SW41 and SW42 coupled in parallel to the capacitors C1 and C2 corresponding to the other laser diodes LD1 and LD2 which are not emitting light are held on. Accordingly, in the light emitting device 501 according to this embodiment, the voltages of the capacitors C1 and C2 corresponding to the other laser diodes LD1 and LD2 can be reliably set to 0 V while the laser diode LDn is emitting light.

As described above, in the light emitting device 501 according to this embodiment, while a certain laser diode LD emits light, since the voltage of the capacitor C corresponding to another laser diode LD which does not emit light is reliably set to 0 V, the voltage of the capacitor C corresponding to the other laser diode LD which does not emit light is prevented from becoming an indeterminate voltage, and the capacitor C can be prevented from emitting light due to a transient recovery voltage.

In the light emitting device 501 according to this embodiment, the on and off timings of each of the plurality of fourth switch elements SW4 may be the timings exemplarily illustrated in FIG. 21, or may be other timings as long as, while a certain laser diode LD emits light, at least the fourth switch element SW4 corresponding to another laser diode LD which does not emit light is off.

Eighth Embodiment

Figure 22:
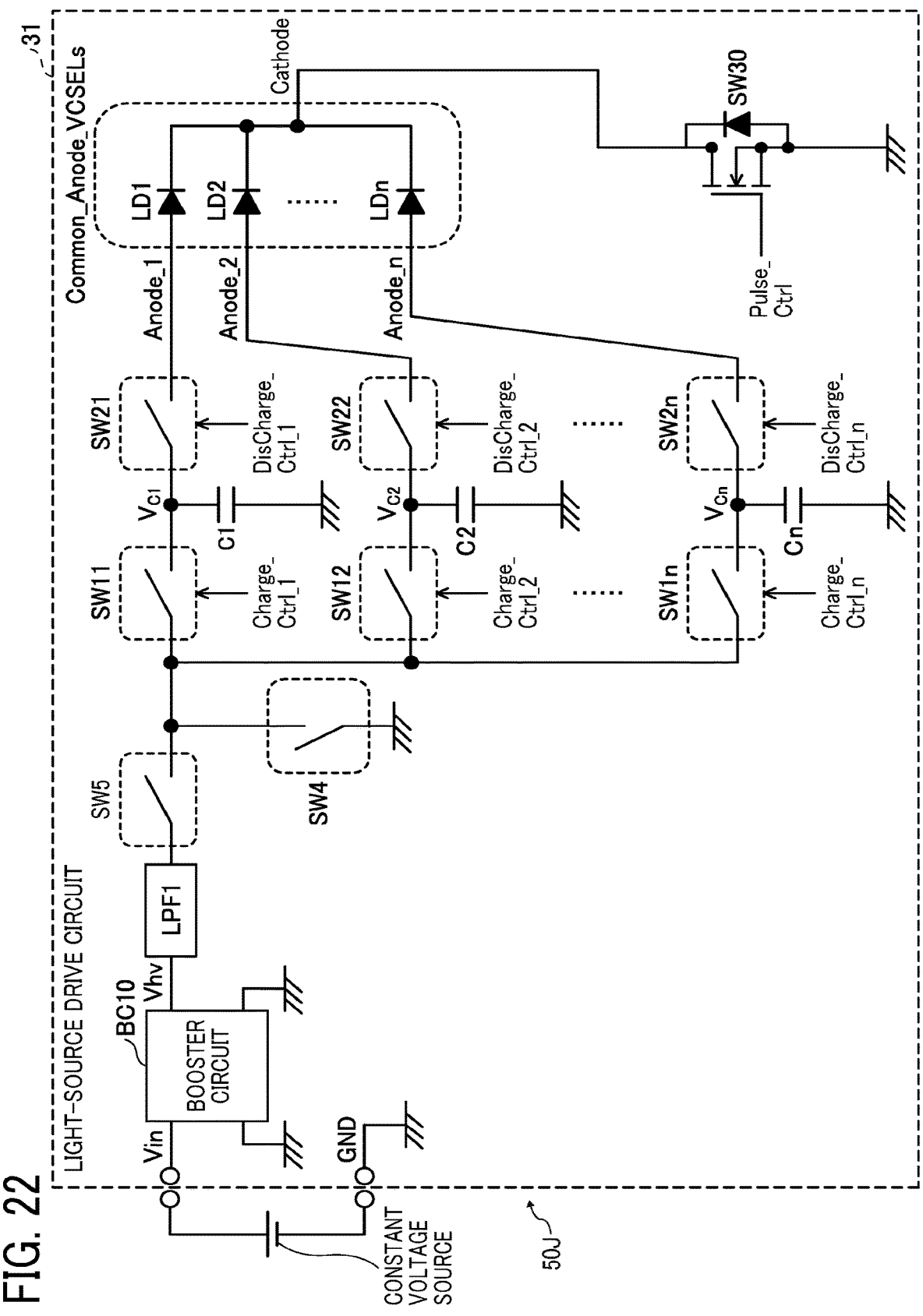
FIG. 22 is a circuit diagram illustrating a light emitting device according to an eighth embodiment of the disclosure.

FIG. 22 is a circuit diagram illustrating a light emitting device 50J according to an eighth embodiment of the disclosure. As illustrated in FIG. 22, the light emitting device 50J according to this embodiment differs from the light emitting device 50A according to the first embodiment illustrated in FIG. 9 in that a fourth switch element SW4 and a fifth switch element SW5 are provided between a low pass filter LPF1 and a plurality of first switch elements SW (first switch elements SW11, SW12, . . . , and SW 1n). In the light emitting device 50J according to this embodiment, when one laser diode LD among the plurality of laser diodes LD emits light, the fourth switch element SW4 and the first switch element SW1 coupled to the capacitor C corresponding to another laser diode LD are turned on, and hence the capacitor C corresponding to the other laser diode LD can be discharged.

The fourth switch element SW4 is coupled in parallel to each of the plurality of first switch elements SW. The fifth switch element SW5 is coupled in series to each of the plurality of first switch elements SW.

Accordingly, the light emitting device 50J according to this embodiment can provide an operation similar to that of the light emitting device 501 according to the seventh embodiment, by a smaller number of parts than the number of parts of the light emitting device 501 Specifically, in the light emitting device 50J according to this embodiment, while a certain laser diode LD emits light, since the fourth diode SW4 and the first switch element SW1 coupled to the capacitor C corresponding to another laser diode LD are turned on, the capacitor C corresponding to the other laser diode LD is grounded, and hence the voltage of the capacitor C corresponding to the other laser diode LD can be reliably set to 0 V.

Figure 23:
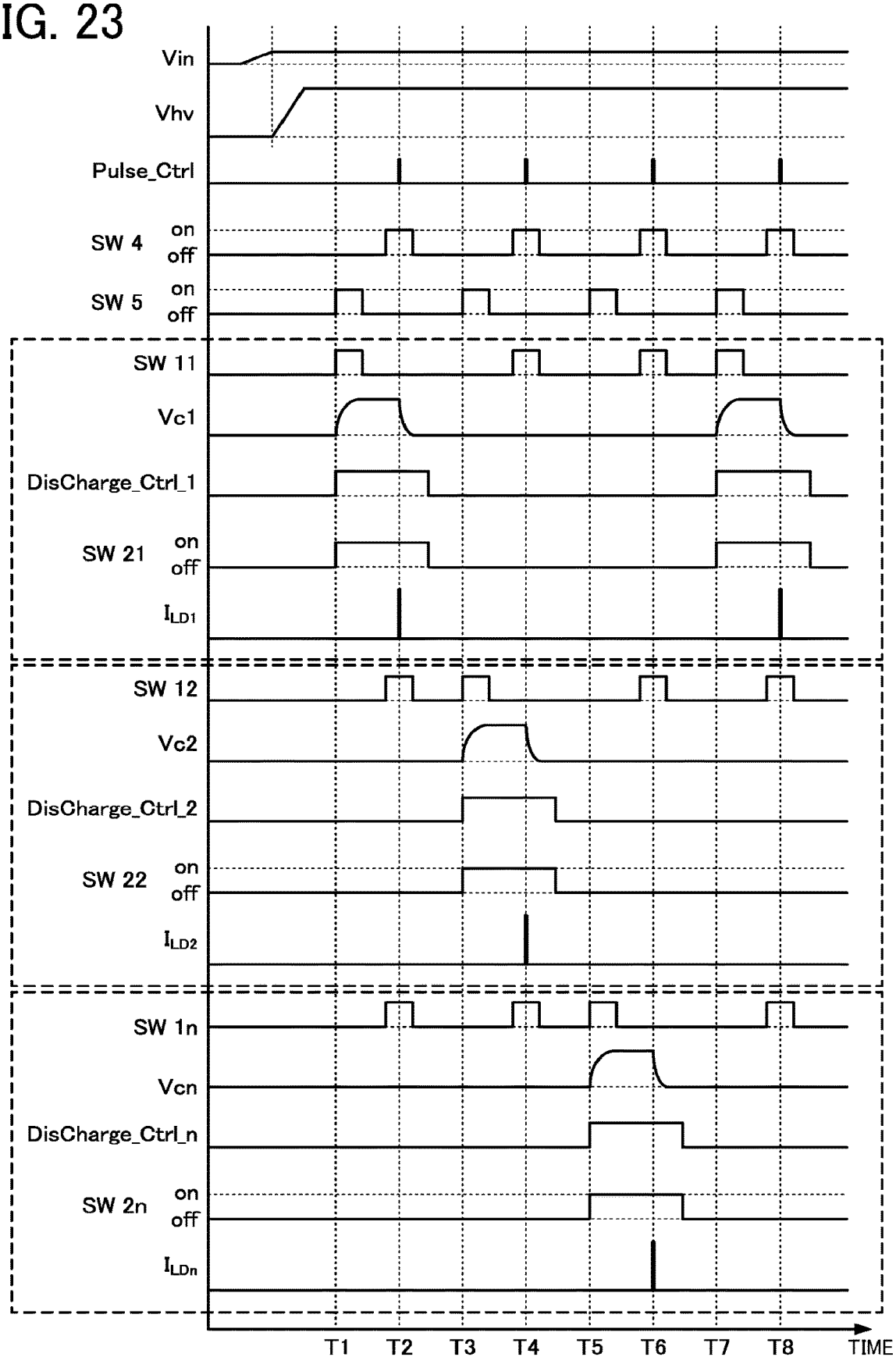
FIG. 23 is a timing chart illustrating various operation timings in the light emitting device according to the eighth embodiment of the disclosure.

FIG. 23 is a timing chart illustrating various operation timings in the light emitting device 50J according to the eighth embodiment of the disclosure. As illustrated in FIG. 23, in the light emitting device 50J according to this embodiment, before a laser diode LD which is an emission target emits light, the fifth switch element SW5 and the first switch element SW1 corresponding to the laser diode LD of the emission target are turned on, and hence the capacitor C corresponding to the laser diode LD of the emission target can be charged with the direct-current voltage Vhv.

In the light emitting device 50J according to this embodiment, while a certain laser diode LD emits light, the first switch element SW1 corresponding to another laser diode LD and the fourth switch element SW4 are turned on. Accordingly, in the light emitting device 50J according to this embodiment, while a certain laser diode LD emits light, the capacitor C corresponding to another laser diode LD is grounded, and hence the voltage of the capacitor C corresponding to the other laser diode LD can be reliably set to 0 V.

For example, at a time T1 illustrated in FIG. 21, before the laser diode LD1 which is an emission target emits light, the fifth switch element SW5 and the first switch element SW11 corresponding to the laser diode LD1 are turned on, and hence the capacitor C1 corresponding to the laser diode LD1 is charged with the direct-current voltage Vhv.

At a time T2, the laser diode LD1 is emitting light, and the other laser diodes LD2 and LDn are not emitting light. In this case, in the light emitting device 50J according to this embodiment, while the laser diode LD1 emits light, the first switch elements SW corresponding to the other laser diodes LD2 and LDn and the fourth switch element SW4 are turned on. Accordingly, in the light emitting device 50J according to this embodiment, the voltages of the capacitors C2 and Cn corresponding to the other laser diodes LD2 and LDn can be reliably set to 0 V while the laser diode LD1 emits light.

As described above, in the light emitting device 50J according to this embodiment, while a certain laser diode LD emits light, since the voltage of the capacitor C corresponding to another laser diode LD which does not emit light is reliably set to 0 V, the voltage of the capacitor C corresponding to another laser diode LD which does not emit light is prevented from becoming an indeterminate voltage, and the capacitor C can be prevented from emitting light due to a transient recovery voltage.

In the light emitting device 50J according to this embodiment, the on and off timings of each of the plurality of first switch elements SW and of the fourth switch element SW4 may be the timings exemplarily illustrated in FIG. 23, or may be other timings as long as, while a certain laser diode LD emits light, at least the first switch element SW1 corresponding to another laser diode LD which does not emit light and the fourth switch element SW4 are on.

Non-Limitation of Technical Scope

While the eight embodiments of the disclosure have been described above, the embodiments are merely examples and do not intend to limit the technical scope of the disclosure. The disclosure can be implemented through other various embodiments and can be modified in various ways, such as omission or replacement, as far as the modifications are within the gist of the disclosure. The embodiments and modifications thereof are included in the scope and gist of the disclosure described in the specification and so forth, and are included in the disclosure described in the claims and the equivalents of the disclosure.

For example, in the above-described embodiments, the light emitting device 50 is expected to be included in the distance measurement apparatus 1. It is not limited thereto, and the light emitting device 50 may be used for other purposes. That is, each of the embodiments can be applied to another light emitting device other than a light emitting device included in a distance measurement apparatus.

When implemented by the configuration according to each of the embodiments exemplarily described above, the capacitor C11, the capacitor C12, and the capacitor C1n correspond to "a plurality of capacitors" according to the disclosure. Moreover in this case, the first switch element SW11, the first switch element SW12, and the first switch element SW1n correspond to "a plurality of first interrupters" according to the disclosure. Furthermore in this case, the second switch element SW21, the second switch element SW22, and the second switch element SW2n correspond to "a plurality of second interrupters" according to the disclosure. Furthermore in this case, the laser diode LD11, the laser diode LD12, and the laser diode LD1n correspond to "a plurality of light emitting elements" according to the disclosure. Furthermore in this case, the light-source drive circuit 31 corresponds to "a drive circuit" according to the disclosure. Furthermore in this case, the light emitting device 50 corresponds to "a light emitting device" according to the disclosure. Furthermore in this case, the object 2 corresponds to "an object" according to the disclosure. Furthermore in this case, the distance measurement apparatus 1 corresponds to "a distance measurement apparatus" according to the disclosure. Furthermore in this case, the automobile 3 corresponds to "a mobile body" according to the disclosure.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A drive circuit, comprising:
a plurality of capacitors;
a plurality of first interrupters, coupled between a voltage source and the plurality of capacitors, configured to select paths through which electric charges are supplied to the plurality of capacitors; and
a plurality of second interrupters configured to select paths through which the plurality of capacitors supply electric charges to a plurality of light emitting elements,
wherein, in a case where the first interrupters are controlled and a first electric charge is stored in a capacitor corresponding to a first light emitting element included in the plurality of light emitting elements to selectively turn on the first light emitting element, at least while the first electric charge is supplied through a first path to the first light emitting element to be turned on, a second interrupter, which is coupled to a second path through which a second electric charge is configured to be supplied to a second light emitting element not to be turned on, interrupts the second path.

2. The drive circuit according to claim 1,
wherein the plurality of second interrupters is coupled between the plurality of capacitors and a plurality of anodes of the plurality of light emitting elements.

3. The drive circuit according to claim 1, wherein a plurality of diodes is coupled in series to the plurality of light emitting elements.

4. The drive circuit according to claim 1, wherein the plurality of second interrupters is coupled between the plurality of capacitors and a plurality of cathodes of the plurality of light emitting elements.

5. The drive circuit according to claim 4,
wherein the plurality of light emitting elements, the plurality of capacitors, and the plurality of second interrupters are coupled in series to each other, and a plurality of diodes are coupled in parallel to the plurality of light emitting elements, the plurality of capacitors, and the plurality of second interrupters.

6. The drive circuit according to claim 1, wherein the plurality of second interrupters is coupled in series to the plurality of capacitors and the plurality of light emitting elements.

7. The drive circuit according to claim 1, wherein each of the second interrupters is implemented by a semiconductor circuit.

8. The drive circuit according to claim 1, wherein each of the second interrupters is implemented by a mechanical circuit.

9. The drive circuit according to Claim 1. wherein the plurality of light emitting elements is each implemented by a surface emitting laser.

10. The drive circuit according to claim 1, wherein the plurality of light emitting elements is each implemented by an edge emitting laser.

11. The drive circuit according to claim 1, further comprising:
a discharger configured to discharge a capacitor corresponding to a light emitting element not to be turned on among the plurality of light emitting elements, while a light emitting element to be turned on among the plurality of light emitting elements is turned on.

12. A light emitting device comprising:
the drive circuit according to claim 1; and
the plurality of light emitting elements coupled to the drive circuit.

13. A distance measurement apparatus comprising:
the light emitting device according to claim 12,
wherein the distance measurement apparatus measures a distance to an object based on emission of light by the light emitting device.

14. A mobile body comprising:
the distance measurement apparatus according to claim 13.

15. The drive circuit of claim 1, wherein the plurality of second interrupters are respectively coupled between the plurality of first interrupters and the plurality of light emitting elements.

16. A drive circuit, comprising:
a plurality of capacitors;
a plurality of first interrupters configured to select paths through which electric charges are supplied to the plurality of capacitors; and
a plurality of second interrupters configured to select paths through which e plurality of capacitors supply electric charges to a plurality of light emitting elements,
wherein, in a case where the first interrupters are controlled and a first electric charge is stored in a capacitor corresponding to a first light emitting element included in the plurality of light emitting elements to selectively turn on the first light emitting element, at least while the first electric charge is supplied through a first path to the first light emitting element to be turned on, a second interrupter, which is coupled to a second path through which a second electric charge is configured to be supplied to a second light emitting element not to be turned on, interrupts the second path, and
wherein the drive circuit further comprises a discharger configured to discharge a capacitor corresponding to a light emitting element not to be turned on among the plurality of light emitting elements, while a light emitting element to be turned on among the plurality of light emitting elements is turned on.

* * * * *